United States Patent [19]

Watanabe

[11] Patent Number: 5,463,590
[45] Date of Patent: Oct. 31, 1995

[54] MULTI-BANK SEMICONDUCTOR MEMORY DEVICE HAVING COMMON COMMAND DETECTION

[75] Inventor: Yuji Watanabe, Kawasaki, Japan

[73] Assignee: Kabushiki Kaisha Toshiba, Kanagawa, Japan

[21] Appl. No.: 210,343

[22] Filed: Mar. 18, 1994

[30] Foreign Application Priority Data

Mar. 19, 1993 [JP] Japan .................................. 5-085220

[51] Int. Cl.⁶ .................................................. G11C 11/40
[52] U.S. Cl. ...................... 365/230.03; 365/203; 365/222
[58] Field of Search .................................. 365/203, 222, 365/189.01, 189.04, 230.03

[56] References Cited

U.S. PATENT DOCUMENTS

| | | | |
|---|---|---|---|
| 4,829,484 | 5/1989 | Arimoto | 365/222 |
| 4,961,167 | 10/1990 | Kumanoya | 365/222 X |
| 4,989,183 | 1/1991 | Kumanoya | 365/222 |
| 5,295,109 | 3/1994 | Nawaki | 365/222 |

Primary Examiner—David C. Nelms
Assistant Examiner—Son Mai
Attorney, Agent, or Firm—Spensley Horn Jubas & Lubitz

[57] ABSTRACT

A DRAM comprises: a memory cell array divided into a plurality of banks (34, 35; 43, 46) each having a plurality of dynamic type memory cells arranged into substantially a matrix pattern, data being writable in and readable from each memory cell and further the data written in the memory cells being refreshable; activating sections (28, 30) for activating the memory cells to be read, written and refreshed; precharging sections (29, 31) for precharging data lines connected to the memory cells to be read; and command detecting circuits (1, 6, 12, 18, 23) for detecting commands and outputting control signals corresponding to the detected commands, to operate the DRAM in correspondence to the respective commands, each of a plurality of command detecting circuits (1, 6, 12, 18, 23) being provided for a plurality of the banks in common to detect one command. In a computer system having a high speed CPU, for instance, since the CPU and memory can be activated by use of a single clock, it is possible to realize a high speed memory so as to correspond to the high speed CPU, by simplifying the clock control.

37 Claims, 35 Drawing Sheets

BANK ACT/DEACT DESIG CKT

BANK PRECHG GATE CKT

BANK ACT CKT

BANK ACT COM DET CKT

BANK ACT COM GEN CKT

ADD LATCH CKT

BANK ADD LATCH CKT

AUTO-REFRESH COM DET CKT

BOTH-BANK PRECHG DET CKT

AUTO-REFRESH DESIG CKT

REFRESH STATUS DET CKT

AUTO-REFRESH PRECHG DESIG CKT

REFRESH ADD GATE CKT

REFRSH BANK ACT CKT

CTR TEST COL SYS SEL CKT

REFRESH CTR CKT

FIG. 25 (B) $RBS-1 = CT$, $\overline{RBS-1} = \overline{CT}$ (HOW TO CONNECT CTR)

SELF-REFRESH COM DET CKT

SELF-REFRESH DESIG CKT

SELF-REFRESH TIMING PULSE GEN CKT

SELF-FORCED PRECHG DESIG CKT

PRECHG COM DET CKT

PRECHG BANK DET CKT

BANK PRECHG COM GEN CKT

BANK PRECHG CKT

AUTO-PRECHG DET CKT

AUTO-PRECHG BANK DESIG CKT

MODE CHANGE DET CKT

MODE ADD ACQ CKT

MODE CHANGE PULSE GEN CKT

SCRAMBLE DECODER CKT

LATENCY DECODER CKT

TEST MODE DECODER CKT

MODE CHANGE DET CKT

ROW PARTIAL DECODER CKT
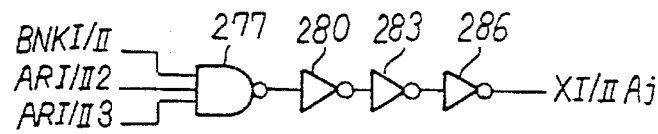
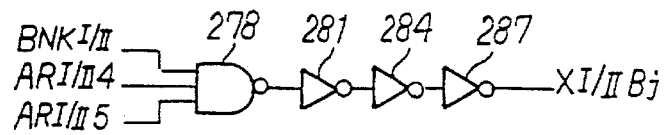
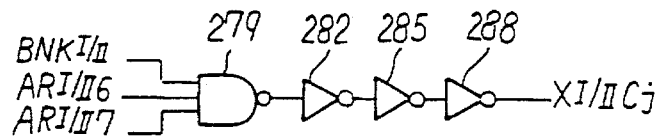
FIG. 45 (A)
FIG. 45 (B)
| XAj | AR3 | AR2 |
|---|---|---|
| 0 | 0 | 0 |
| 1 |   | 1 |
| 2 | 1 | 0 |
| 3 |   | 1 |
FIG. 45 (C)
| XBj | AR5 | AR4 |
|---|---|---|
| 0 | 0 | 0 |
| 1 |   | 1 |
| 2 | 1 | 0 |
| 3 |   | 1 |
FIG. 45 (D)
| XCj | AR7 | AR6 |
|---|---|---|
| 0 | 0 | 0 |
| 1 |   | 1 |
| 2 | 1 | 0 |
| 3 |   | 1 |
WL DECODER CKT
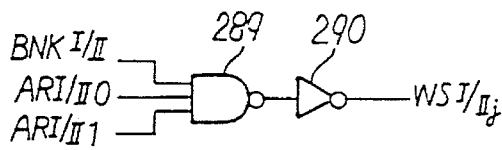
FIG. 46 (A)
| WSj | AR1 | AR0 |
|---|---|---|
| 0 | 0 | 0 |
| 1 |   | 1 |
| 2 | 1 | 0 |
| 3 |   | 1 |
FIG. 46 (B)

ROW BLOCK SEL CKT

| AR10 | 0 | | | | 1 | | | |
|---|---|---|---|---|---|---|---|---|
| AR9 | 0 | | 1 | | 0 | | 1 | |
| AR8 | 0 | 1 | 0 | 1 | 0 | 1 | 0 | 1 |
| j | 0 | 1 | 2 | 3 | 4 | 5 | 6 | 7 |

WL ACT CONT CKT

WL DRIVER DECODER CKT

CORE SECT PRECHG CKT

WL BOOST CKT

SENSE AMP GATE DRIVER CKT

BANK ADD LATCH CKT

MODE ADD LATCH CKT

MULTI-BANK SEMICONDUCTOR MEMORY DEVICE HAVING COMMON COMMAND DETECTION

FIELD OF THE INVENTION

The present invention relates to a semiconductor memory device, and more specifically to a high speed semiconductor memory device (DRAM) suitable for use with a relatively small-scale system provided with a high speed CPU, for instance such as minicomputer, work station, etc.

BACKGROUND OF THE INVENTION

Recently, the operating speed of the CPU has been improved markedly to such an extent as to exceed the operating speed of DRAMs, with the result that there arises a problem in that the operating speed of the DRAM is slower than that of the CPU.

To overcome the above-mentioned problem, various configurations have been so far considered such that the main memory section including DRAMs is composed of a plurality of banks, the memory device is operated in an interleave mode, etc. In the conventional configuration as described above, however, since the operating speed of the memory device has been apparently increased relative to that of the CPU by executing the memory access to a plurality of banks only in parallel to each other, there exist other problems in that the control method of the memory device and further the peripheral circuits of the memory device have been both complicated.

In particular, when the conventional memory device is incorporated with a relatively small-scaled computer system (e.g., minicomputer, work station, etc.), the system is complicated in particular. In more detail, when the memory bank access method or the memory interleave method is adopted for the relatively small-scaled system, the hardware configuration becomes complicated, so that the system cost and the system size both increases.

In addition, when the operating frequency of the CPU has been increased to the degree of 50 MHz or 100 MHz, it is not easy to utilize the memory device effectively. In other words, a more ingenious memory architecture is required for a high operating speed CPU, so that the memory system is further complicated.

On the other hand, the memory device of pipeline operation has been so far proposed to overcome the problem with respect to the memory system complication. When the internal circuits of the memory device are simply operated in pipeline mode, however, the operating speed of the memory device is determined on the basis of the data read speed from the core section. In other words, there exists a problem in that it has been so far difficult to increase the operating speed of the memory device up to that of the high speed CPU.

SUMMARY OF THE INVENTION

With these problems in mind, therefore, it is the object of the present invention to provide a semiconductor memory device (DRAM) suitable for use with a computer system provided with a high speed CPU, which can increase the operating speed of the memory device without complicating the control system therefor.

To achieve the above-mentioned object, the present invention provides a DRAM comprising: a memory cell array divided into a plurality of banks each having a plurality of dynamic type memory cells arranged into substantially a matrix pattern, data being writable in and readable from each memory cell and further the data written in the memory cells being refreshable; activating means for activating the memory cells to be read, written and refreshed; precharging means for precharging data lines connected to the memory cells to be read; and command detecting means for detecting commands and outputting control signals corresponding to the detected commands, to operate the DRAM in correspondence to the respective commands, said command detecting means being composed of a plurality of command detecting circuits each provided for a plurality of said banks in common to detect one command.

Further, the DRAM further comprises a plurality of address latch sections each provided for each bank, each for latching addresses of the memory cells to be read, written and refreshed, each of said address latch sections being set to a latch status when said bank is activated and to a latch release status when said bank is precharged.

Further, said activating means comprises a plurality of activating circuits each corresponding to each of said banks; and said precharging means comprises a plurality of precharging circuits each corresponding to each of said bank.

Further, the DRAM further comprises an address buffer for storing addresses indicative of the memory cells to be activated and for outputting the stored addresses to said address latch sections; and wherein said command detecting means comprises an activated command detecting circuit, when said activated command detecting circuit detects an activation command, said address buffer, said address latch section and said activating circuit both corresponding to the activation command being operated to latch the addresses stored in said address buffer by said address latch section and thereby to activate the memory cells of the bank corresponding to the addresses latched by said corresponding address latch section, through said activating circuit.

Further, when two active commands are applied twice repeatedly from said activating circuits to the bank corresponding thereto, each of said bank is operated on the basis of a first command, without regard for a second command.

Further, the DRAM further comprises: a read register for storing data read from the memory cells; and a control circuit for controlling said read register for outputting data to an output buffer, after the precharge command for allowing data read from said read register to be invalid has been inputted, said control circuit controls said read register so as to output valid read data obtained before being allowed to be invalid.

Further, the DRAM further comprises all-bank precharging means for outputting an all-bank precharge signal for precharging all the banks forcedly to said precharge means; and precharge gating means for outputting a precharge gating signal for preventing one or plural of said banks from being precharged, the all bank precharge signal being invalidated by the precharge gating signal.

Further, the refresh is executed when an auto-refresh command detecting circuit detects that an auto-refresh command is applied thereto periodically; and self-refresh is executed when a self-refresh command detecting circuit outputs an self-refresh command periodically applied thereto to the auto-refresh command detecting circuit.

Further, the refresh is executed for the memory cells of the addresses designated by a refresh counter; and in counter test, a column system of said bank including the memory cells designated by the refresh counter is automatically activated.

In the DRAM according to the present invention, since only one single command detecting means is provided for each command in common for the memory cells divided into a plurality of banks, it is possible to simplify the clock control.

Further, the address latch means is provided for each bank of the memory cells. The address latch means is in a latch status when the respective bank is activated and in a latch release status when the bank is precharged.

.Further, all the bank precharge can be inhibited by a logic circuit when any one of the banks is in a bank precharge gating status.

Further, the self-refresh can be executed when a signal is applied from the counter means to the auto-refresh detecting means.

Further, in the counter test, the column system of the bank having the memory cells designated by the refresh counter is automatically activated. Further, when the memory activation command is detected by the activation command detecting means, the memory cells are activated on the basis of the designation of the bank address buffer.

Further, when the activation command is inputted twice or more to the same bank, the activation designation is limited.

Further, even if the respective bank is in the precharge status, it is possible to read data from the bank now being precharged.

BRIEF DESCRIPTION OF THE DRAWINGS

FIG. 45(A) is a circuit diagram showing a row partial decoder circuit;

FIGS. 45(B), 45(C) and 45(D) are logical/tables thereof;

FIG. 46(A) is a circuit diagram showing a work line decoder circuit;

FIG. 46(B) is a logical table thereof;

DETAILED DESCRIPTION OF THE PREFERRED EMBODIMENTS

Figure 1:
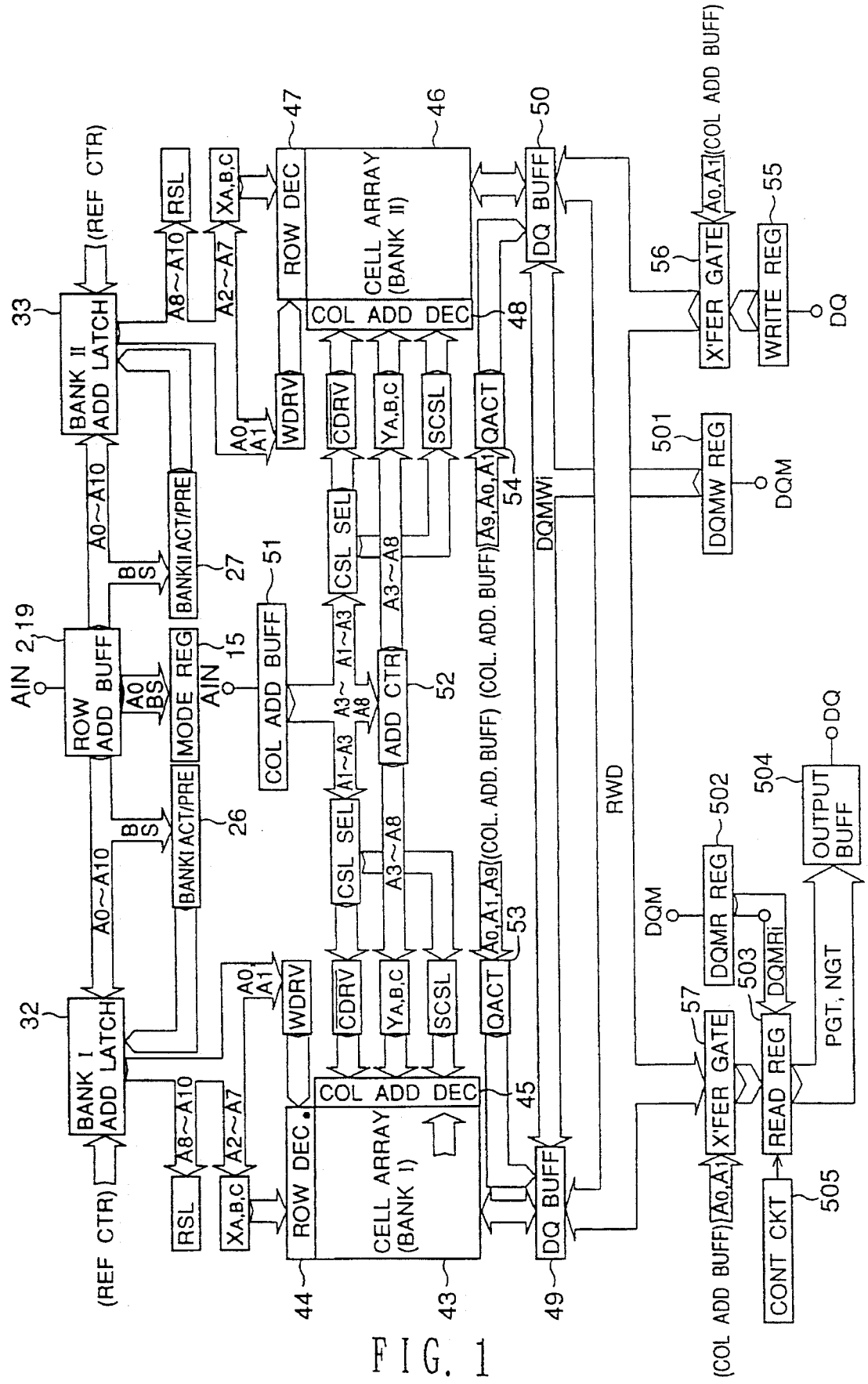
FIG. 1 is a block diagram showing a first embodiment of the semiconductor memory device according to the present invention.

The embodiment of the semiconductor memory device (DRAM) according to the present invention will be described hereinbelow with reference to the attached drawings.

Prior to the detailed description thereof, the features of the semiconductor memory device (DRAM) according to the present invention will be summarized below:

(1) A plurality of banks are arranged. However, only a single command detecting section is provided for each command in common for all the banks.

(2) An address latch section is arranged for each bank, respectively. The address latch section for each bank is set to a latch status when the bank is activated and to a latch release status when the bank is precharged.

(3) The all-bank precharge designation is disregarded when any of the banks is in a precharge gating status.

(4) The self-refresh is realized when the autorefresh commands are apparently inputted periodically.

(5) In counter test, a column system of the bank designated by the refresh counter is automatically activated. In this case, the BS designated in the column access cycle is disregarded.

(6) The output of the address buffer is inputted to the bank address latch section. The bank is activated when the bank activate/precharge signal is activated on the basis of the input command.

(7) When the active commands are repeatedly inputted twice to the same bank, the bank activate/precharge designation F/F section disregards the second command.

(8) Even after the bank has been precharged, the bank can be accessed to output data therefrom.

Further, the DRAM according to the present invention comprises: a memory cell array divided into a plurality of banks each having a plurality of dynamic type memory cells arranged into substantially a matrix pattern, data being writable in and readable from each memory cell and further the data written in the memory cells being refreshable; activating means for activating the memory cells to be read, written and refreshed; precharging means for precharging data lines connected to the memory cells to be read; and command detecting means for detecting commands and outputting control signals corresponding to the detected commands, to operate the DRAM in correspondence to the respective commands, the command detecting means being composed of a plurality of command detecting circuits each provided for a plurality of the banks in common to detect one command.

Further, the DRAM further comprises a plurality of address latch sections each provided for each bank, each for latching addresses of the memory cells to be read, written and refreshed, each of the address latch sections being set to a latch status when the bank is activated and to a latch release status when the bank is precharged.

Further, the activating means comprises a plurality of activating circuits each corresponding to each of the banks; and the precharging means comprises a plurality of precharging circuits each corresponding to each of the bank.

Further, the DRAM further comprises an address buffer for storing addresses indicative of the memory cells to be activated and for outputting the stored addresses to the address latch sections; and wherein the command detecting means comprises an activated command detecting circuit, when the activated command detecting circuit detects an activation command, the address buffer, the address latch section and the activating circuit both corresponding to the activation command being operated to latch the addresses stored in the address buffer by the address latch section and thereby to activate the memory cells of the bank corresponding to the addresses latched by the corresponding address latch section, through the activating circuit.

Further, when two active commands are applied twice repeatedly from the activating circuits to the bank corresponding thereto, each of the bank is operated on the basis of a first command, without regard for a second command.

Further, the DRAM further comprises: a read register for storing data read from the memory cells; and a control circuit for controlling the read register for outputting data to an output buffer, after the precharge command for allowing data read from the read register to be invalid has been inputted, the control circuit controls the read register so as to output valid read data obtained before being allowed to be invalid.

Further, the DRAM further comprises all-bank precharging means for outputting an all-bank precharge signal for precharging all the banks forcedly to the precharge means; and precharge gating means for outputting a precharge gating signal for preventing one or plural of the banks from being precharged, the all bank precharge signal being invalidated by the precharge gating signal.

Further, the refresh is executed when an auto-refresh command detecting circuit detects that an auto-refresh command is applied thereto periodically; and self-refresh is executed when a self-refresh command detecting circuit outputs an self-refresh command periodically applied thereto to the auto-refresh command detecting circuit.

Further, the refresh is executed for the memory cells of the addresses designated by a refresh counter; and in counter test, a column system of the bank including the memory cells designated by the refresh counter is automatically activated.

FIG. 1 is a schematic block diagram showing a first embodiment of the semiconductor memory device according to the present invention, in which the address flow and data flow are both shown.

In FIG. 1, a row decoder 44 and a column decoder 45 are connected to a cell array 43 of a first bank I. On the other hand, a row decoder 47 and a column decoder 48 are connected to a cell array 46 of a second bank II. Further, a DQ buffer 49 is connected to the cell array 43, and a DQ buffer 50 is connected to the cell array 46, respectively.

Further, an address AIN is given to row address buffers 2 and 19 and a column address buffer 51, respectively. Addresses A0 to A10 from the row address buffers 2 and 19 are outputted to a bank I address latch 32 and a bank II address latch 33, respectively. An address BS is given to a bank I activate/precharge designating section 26 and a bank II activate/precharge designating section 27. Further, addresses A0 to BS from the row address buffers 2 and 19 are outputted to a mode register 15.

The addresses A0 and A1 from the bank I address latch 32 are given to a decoder circuit WDRV and the addresses A2 to A7 are given to an $X_{A,B,C}$ circuit, and the addresses A8 to A10 are given to an RSL circuit, respectively. The addresses A0 and A1 from the bank II address latch 33 are given to a decoder circuit WDRV and the addresses A2 to A7 are given to an $X_{A,B,C}$ circuit, and the addresses A8 to A10 are given to an RSL circuit, respectively.

The column addresses A1 to A3 from a column address buffer 51 are given to two CSL selector circuits, respectively. The outputs of the two CSL circuits are applied to a /CDRV circuit and a SCSL circuit, respectively. Further, the addresses A3 to A8 from the column address buffer 51 are outputted to an address counter 52. The address outputs A3 to A8 from the address counter 52 are applied to two $Y_{A,B,C}$ circuits, respectively.

On the other hand, the addresses A0, A1 and A9 from the column address buffer 51 are given to QACT circuits 53 and 54, respectively. Outputs of the QACT circuits 53 and 54 are applied to the DQ buffers 49 and 50, respectively.

Input data DQ are inputted through a write register 55. The input data DQ are applied to the cell arrays 43 and 46 of the banks I and II through a transfer (X'fer) gate circuit 56 and the DQ buffers 49 and 50, respectively. Further, the addresses A0 and A1 from the column address buffer 51 are inputted to transfer gate circuits 56 and 57, respectively.

A DQM signal is applied to $DQMW_i$ via a DQMW register 501. The $DQMW_i$ is connected to the DQ buffers 49 and 50. Further, the DQM signal is applied to the $DQMR_i$ through a DQMR register 502. The $DQMR_i$ is connected to a read register 503. The output signals (PGT and NGT) of the read register 503 are read as output data DQ through an output buffer 504. A control circuit 505 is connected to the read register 503. The control circuit 505 controls the read register 503 so that valid data can be outputted after a precharge command has been inputted. In other words, the control circuit 505 outputs effective data (obtained before the data read from the cell arrays 43 and 46 in response to the precharge command become invalid), after the precharge command has been inputted.

Here, the $X_{A,B,C}$ circuit and the row decoder WDRV are connected to the row decoders 44 and 47, respectively. Further, a /CDRV circuit, a $Y_{A,B,C}$ circuit, and a SCSL circuit are connected to the column decoders 45 and 46, respectively.

Figure 2:
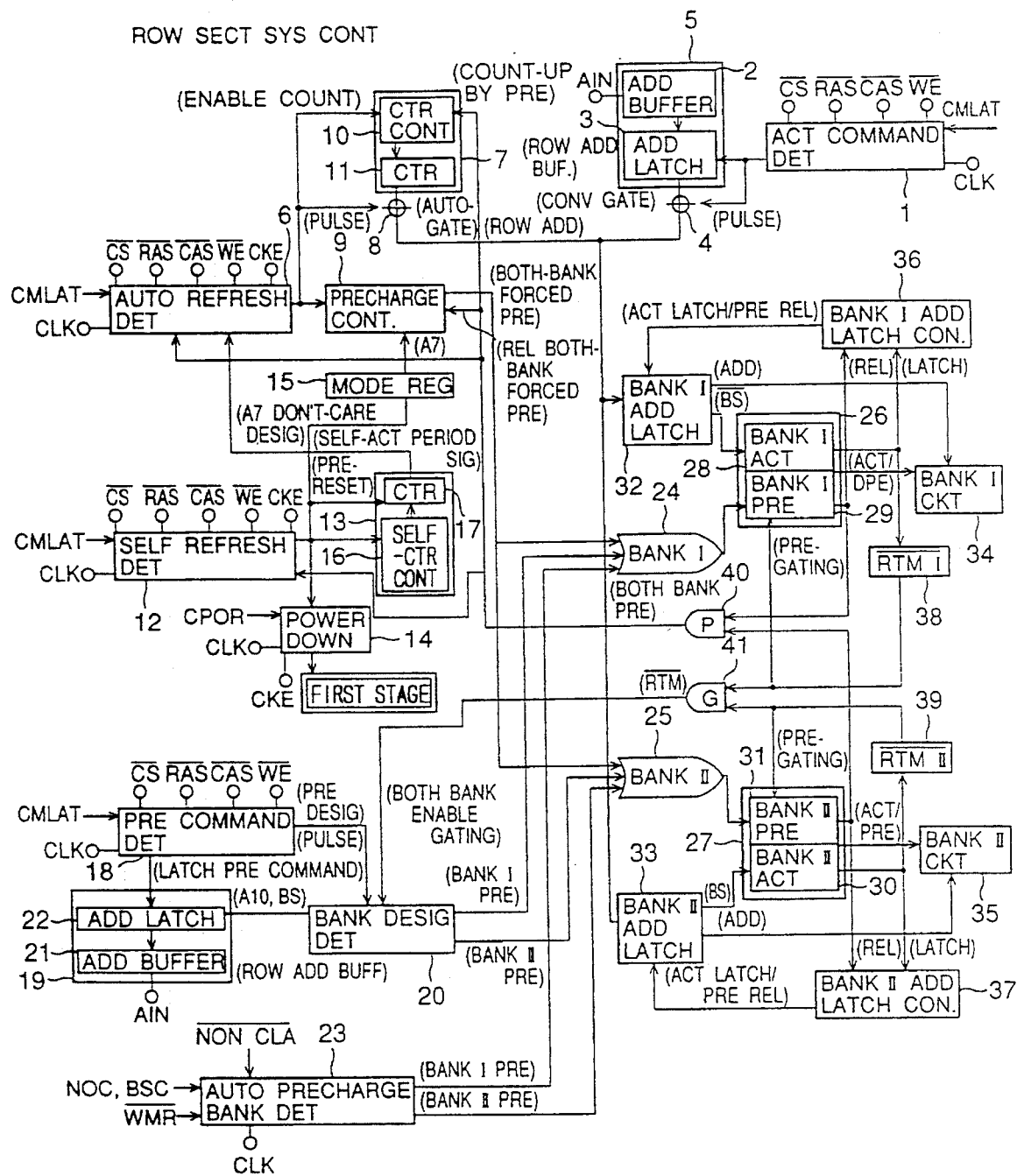
FIG. 2 is a block diagram Showing a row control section of the first embodiment shown in FIG. 1.

FIG. 2 is a diagram showing a row system control section of the semiconductor memory device shown in FIG. 1, which indicates a row system architecture of a synchronous DRAM, in particular.

In FIG. 2, various signals /CS, /RAS, /CAS, /WE, CLK and CMLAT are given to an ACT command detecting section 1. The output of the ACT command detecting section 1 is given to an address latch 3 (of the row address buffer 2) and a gate 4. Further, an address AIN is inputted to an address buffer 5 of the row address buffer 2. The input address AIN is further outputted to row address lines via the address latch 3 as a row address.

Further, various signals /CS, /RAS, /CAS, /WE, CLK, CKE and CMLAT are given to an automatic refresh detecting circuit 6. The output of the automatic refresh detecting circuit 6 is given to an automatic refresh counter 7, a gate 8 and a precharge control section 9. The automatic refresh counter 7 is provided with a counter control 10 and a counter 11. The output of the counter 7 is applied to the row address lines via the gate 8. Further, the output of the precharge control section 9 is applied to two OR gates 24 and 25 as a both-bank precharge signal. The OR gate 24 outputs a precharge signal for precharging the bank I to a bank I precharge section 29 of a bank I activate/precharge designating section 26. The OR gate 25 outputs a precharge signal for precharging the bank II to a bank II precharge section 31 of a bank II activate precharge designating section 27.

Further, the bank I activate/precharge designating section 26 has a bank I activating section 28 and a bank I precharge section 29. The output of the OR gate 24 is given to the bank I precharging section 29. On the other hand, the bank II activate/precharge designating section 27 has a bank II activating section 30 and a bank II precharging section 31. The output of the OR gate 25 is given to the bank II precharging section 31.

Further, various signals /CS, /RAS, /CAS, /WE, CLK, CKE and CMLAT are given to a self-refresh detecting section 12. The output of the self-refresh detecting section 12 is given to a self-refresh counter 13, a power down section 14, and a mode register 15. The self-refresh counter 13 has a self-counter control 16 and a counter 17. The output of the counter 13 is outputted to an automatic refresh detecting section 6 as a self-activation period signal. Further, signals CLK, CPOR and CKE are given to a power down section 14. The output of the power down section 14 is outputted to the first stage. On the other hand, the signal given from the self-refresh detecting section 12 to the mode register 15 is used as a don't-care designation signal for ignoring the address A7. Further, a signal corresponding to the address A7 is given from the mode register 15 to the precharge control section 9. Further, the output of the pre-command precharge detecting section 18 (to which /CS, /RAS, /CAS, /WE, CLK, and CMLAT are given) is given to the row address buffer 19 as a latch precommand, and further to a bank designation detecting section 20 as a pre-designation pulse. The row address buffer 19 has an address buffer 21 to which an address AIN is given, and an address latch 22 for latching the output of the buffer 21 to output the latched signals as A10 and BS. The outputs A10 and BS of the row address buffer 19 are given to the bank designation detecting section 20. The bank designation detecting section 20 outputs a bank I precharge signal and a bank II precharge signal. Further, the bank I precharge signal is given to the OR gate 24, and the bank II precharge signal is given to the OR gate 25, respectively.

On the other hand, signals /NONCLA, /WMR, A1OC, BSC, and CLK are inputted to an automatic precharge bank detecting section 23. The automatic precharge bank detecting section 23 outputs the bank I precharge signal applied to the OR gate 24 and the bank II precharge signal applied to the OR gate 25, respectively.

The row address lines connected to the row address buffer 2 and the counter 7 are connected to the bank I address latch 32 and the bank II address latch 33, respectively. The address latched by the bank I address latch 32 is outputted to a bank I circuit 34 and the address latched by the bank II address latch 33 is outputted to a bank II circuit 35, respectively.

An activate/precharge release signal is outputted from the bank I address latch control section 36 to the bank I address latch 32. An activate/precharge release signal is outputted from the bank II address latch control section 37 to the bank II address latch 33.

The bank I address latch 32 outputs the/BS to the bank I activating section 28 of the bank I activate/precharge designating section 26. The bank II address latch 33 outputs the/BS to the bank II activating section 30 of the bank I activate/precharge designating section 27.

The bank I activating section 28 of the bank I activate/precharge designating section 26 gives a latch signal to a bank I address latch control section 36 and a /RTMI section 38. On the other hand, the bank II activating section 30 of the bank II activate/precharge designating section 27 gives a latch signal to a bank II address latch control section 37 and a /RTMII section 39.

The bank I precharging section 29 of the bank I activate/precharge designating section 26 gives a release signal to a bank I address latch control section 36 and an AND gate 40. On the other hand, the bank II precharging section 31 of the bank II activate/precharge designating section 27 gives a release signal to a bank II address latch control section 37 and the AND gate 40.

The bank I activate/precharge designating section 26 outputs an activate/precharge signal to a bank I circuit 34. The bank II activate/precharge designating section 27 outputs an activate/precharge signal to a bank I circuit 35.

The output of the/RTMI section 38 is outputted to an AND gate 41 and further to the bank I precharging section 29 of the bank I activate/precharge designating section 26 as a precharge gating signal. On the other hand, the output of the/RTMII section 39 is outputted to the AND gate 41 and further to the bank II precharging section 31 of the bank II activate/precharge designating section 31 as a precharge gating signal.

Further, the both-bank precharge signal is applied from the AND gate 40 to the self-refresh detecting section 12, the automatic refresh detecting section 6, the precharge control section 9 and the counter control 10 of the counter 7, respectively. The precharge control section 9 uses this both-bank precharge signal as a both-bank forced release signal. On the other hand, the /RTM signal is applied from the AND gate 41 to the bank designation detecting section 20 as a both-bank enable gating signal.

As understood in FIG. 2, there are only one command inputting section (such as the activate command detection section 1, the automatic refresh selecting section 6, the self-refresh detecting section 12, the precharge command detecting section 18, the automatic precharge band detecting section 23, etc.), the row address buffer 2, the row address buffer 19, the automatic refresh counter 7, and the self-refresh counter 13 as a whole. In contrast with this, there are a plurality of bank activate/precharge designating sections 26 and 27, whose number corresponds to the number of the banks.

The core section is controlled on the basis of the signal for designating the bank activate/precharge designating sections 26 and 27.

Figure 3:
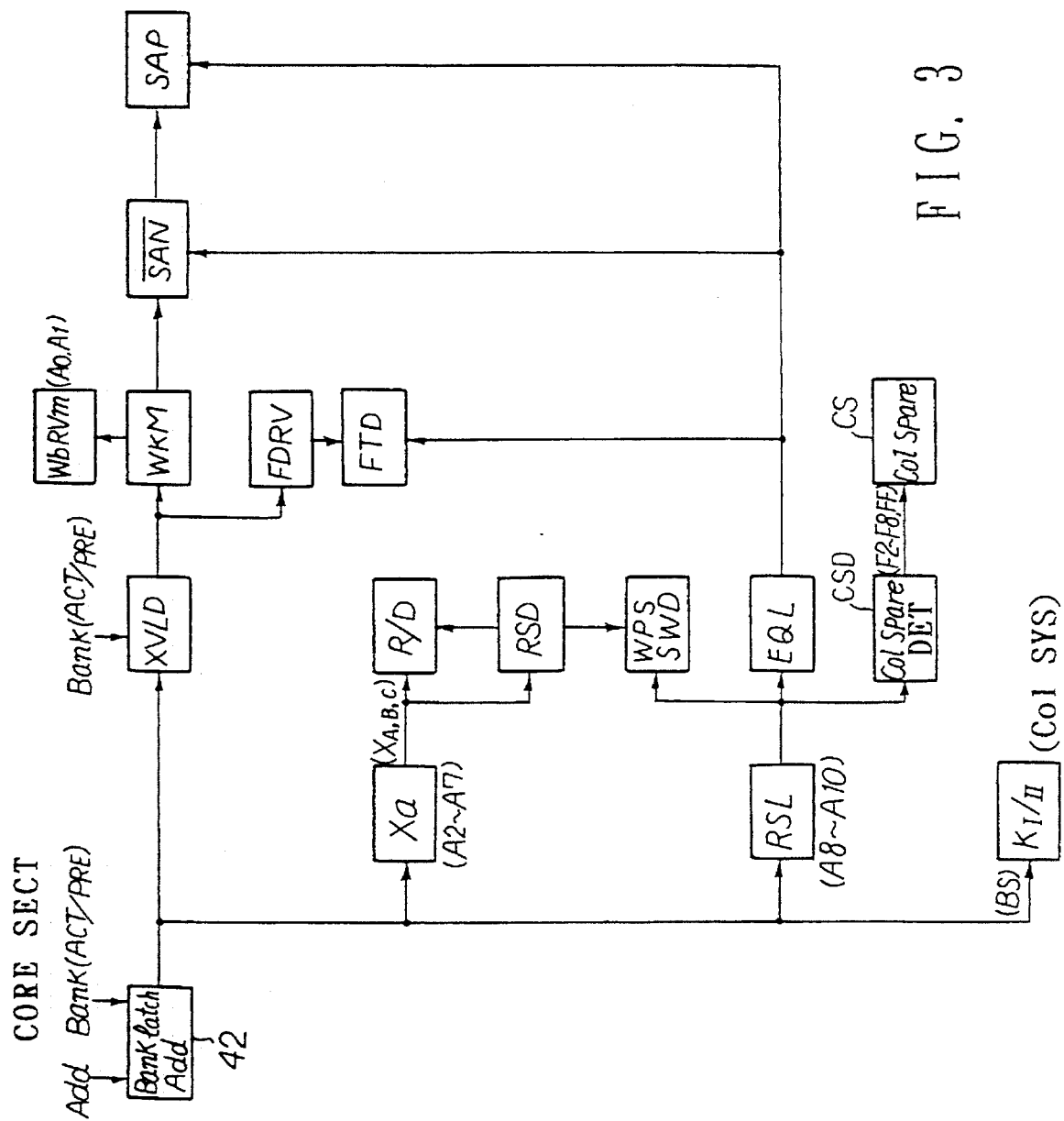
FIG. 3 is a block diagram showing a core section of the first embodiment shown in FIG. 1.

As shown in FIG. 3, the address Add and the bank (activate/precharge) designating signal are given to a bank latch address circuit 42. The addresses A0 and A1 are outputted to a decode section WDRVm. The addresses A2 and A7 are outputted to an Xa circuit. The addresses A8 and A10 are outputted to an RSL circuit. The BS is outputted to a KI/II circuit. The output $X_{A,B,C}$ Of the Xa circuit is outputted to a R/D circuit and a row spare decoder RSD. On the other hand, the output of the RSL circuit is outputted to a WPSSWD circuit, an EQL circuit, and a column spare detecting circuit CSD, respectively. The outputs F2 to F8 and FF of the column spare detecting circuit CSD are given to a column spare circuit CS. Further, the output of the row spare decoder RSD is outputted to an R/D circuit and a WPSSWD circuit. Further, a signal generating circuit XVLD generates a signal for activating the word lines on the basis of the bank (activate/precharge) designating signal. A charge supply circuit WKM is a circuit for supplying a charge to the word lines. A decode section WDRVm decodes the word lines on the basis of the addresses A0 and A1. A sense amplifier /SAN and a driver SAP are used to read data from the word lines. A signal circuit FTD generates a signal for connecting the cell array to the sense amplifier /SAN. A charge supplying circuit FDRV supplies a charge to a signal circuit FTD. An EQL circuit is connected to the signal circuit FTD, the sense amplifier /SAN and the driver SAP, respectively.

All the circuits as described above are activated on the basis of the bank (activate/precharge) designating signal, respectively.

Figure 4:
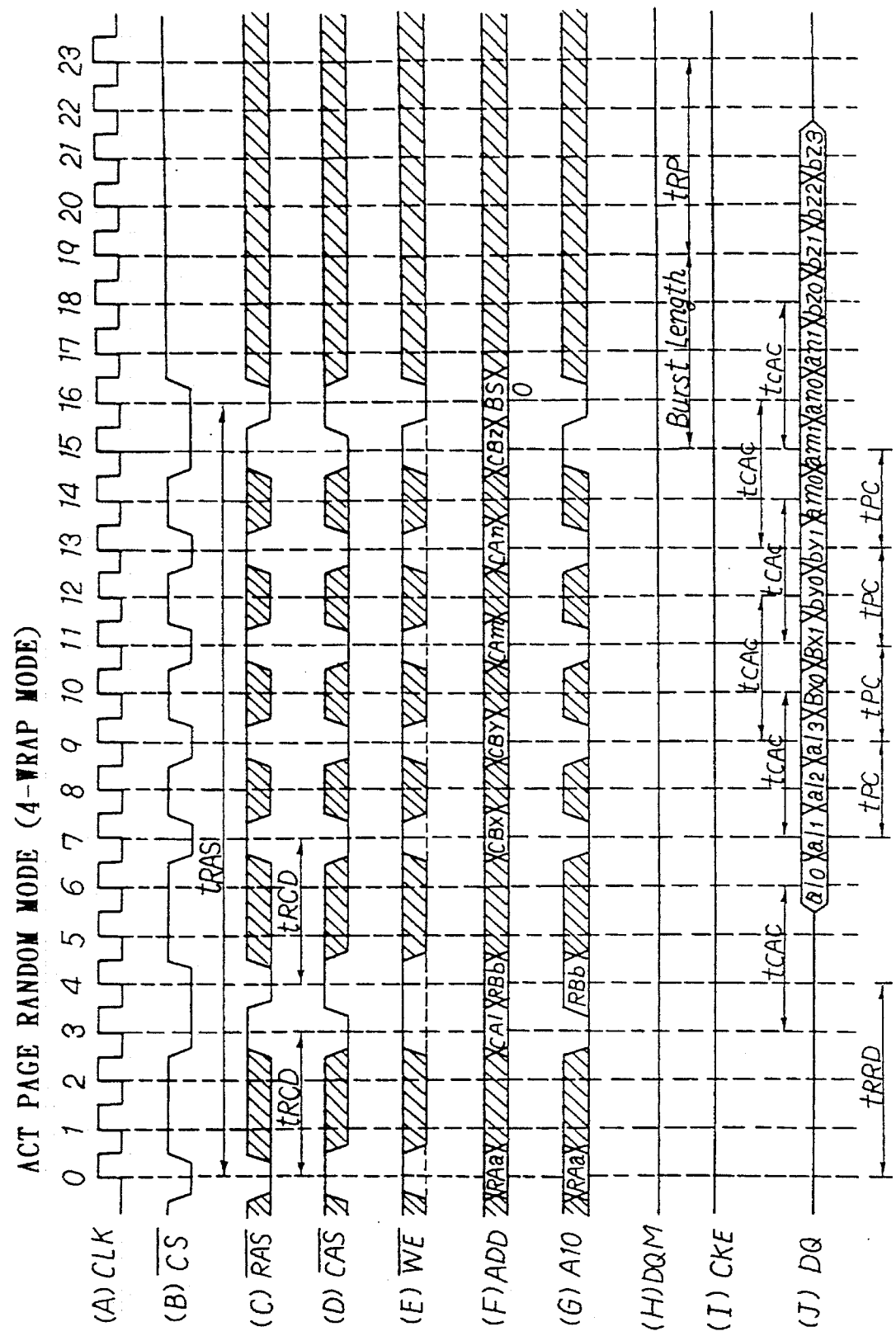
FIG. 4 is a timing chart for assistance in explaining an active page random read (4-wrap) mode.

FIG. 4 is a timing chart for explaining the operation (hidden row operation, in particular) of the semiconductor memory device as constructed above. In the drawing, the 4-wrap mode of the active page random read executed by a 16M synchronous DRAM is shown, in which (A) denotes the CLK; (B) denotes the/CS; (C) denotes the/RAS; (D) denotes /CAS; (E) denotes the/WE; (F) denotes the ADD; (G) denotes the address A0; (H) denotes the DQM; (I) denotes the CKE; and (J) denotes the DQ, respectively.

As understood by FIG. 4, the semiconductor memory device according to the present invention can execute the operation which cannot be so far executed by the general purpose DRAM, for instance such that data can be outputted during precharge operation, any bank precharge can be combined by activating different banks, etc. Therefore, when different banks are designated alternately, it is possible to shorten the substantial cycle time.

Further, there has been so far known the automatic refresh which corresponds to the CAS-before RAS refresh in the general purpose DRAM. In this automatic refresh, the precharge designation after refresh is not required, which has been so far required for the automatic refresh operation of the general purpose DRAM. In other words, since the refresh is executed automatically after refresh, without executing the precharge designation operation, it is possible to simplify the control operation. On the other hand, in the counter test, as far as the operation is so controlled that the mode is not set to the precharge automatically, there arises no specific problem.

Figure 5:
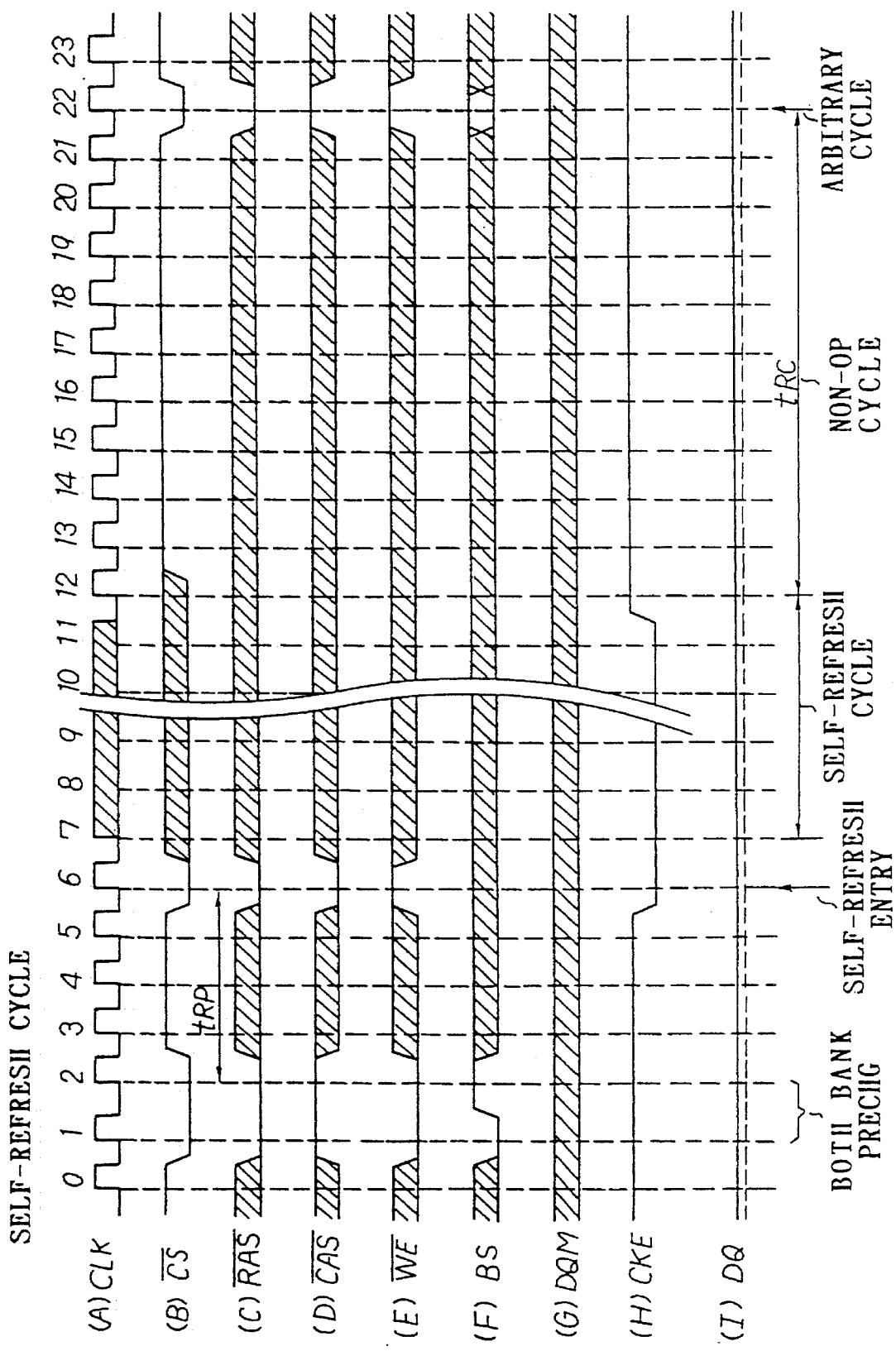
FIG. 5 is a timing chart for assistance in explaining a self-refresh cycle.

FIG. 5 is a timing chart for explaining the self-refresh mode operation for executing the refresh automatically by the semiconductor memory device as constructed above. FIG. 5 shows the self-refresh cycle executed by a 16M synchronous DRAM is shown, in which (A) denotes the CLK; (B) denotes the /CS; (C) denotes the /RAS; (D) denotes /CAS; (E) denotes the /WE; (F) denotes the BS; (G) denotes the DQM; (H) denotes the CKE; and (I) denotes the DQ, respectively.

As shown in FIG. 5, the both-bank precharge period is between the rise edges of the clocks 1 and 2, and the self-refresh entry is determined at the rise edge of the clock 6. Further, the self-refresh cycle is between the rise edges of the clocks 7 and 12. The non-operation cycle is between the rise edges of the clocks 12 and 22, and the arbitrary cycle starts from the rise edge of the clock 22.

The precharge operation for executing the above-mentioned operation will be explained hereinbelow. First, the row system activation will be described on the basis of Table 1.

First, the cell array of the semiconductor memory device must be activated in the following three cases: (1) when the row system activation command is inputted; (2) the device enters the automatic refresh cycle; and (3) the device enters the self-refresh cycle.

In the case of the input of the row activation command, a row address must be acquired and latched on the activated bank side. This is because there exists the case where different addresses are activated in the respective banks, so that the address must be latched for the respective banks.

Further, it is necessary to allow the bank once activated to be so controlled that the precharge command will not be received for a constant time period. This is because when the precharge is effected again within a predetermined time period in the activated bank, the cell data may be destroyed. Further, in the case of the self-refresh cycle, the automatic refresh circuits are activated periodically.

In the case of the automatic refresh, the cells corresponding to the internal counter addresses are refreshed. The automatic refreshing counters are incremented when the precharge starts after the automatic refresh.

Figure 6:
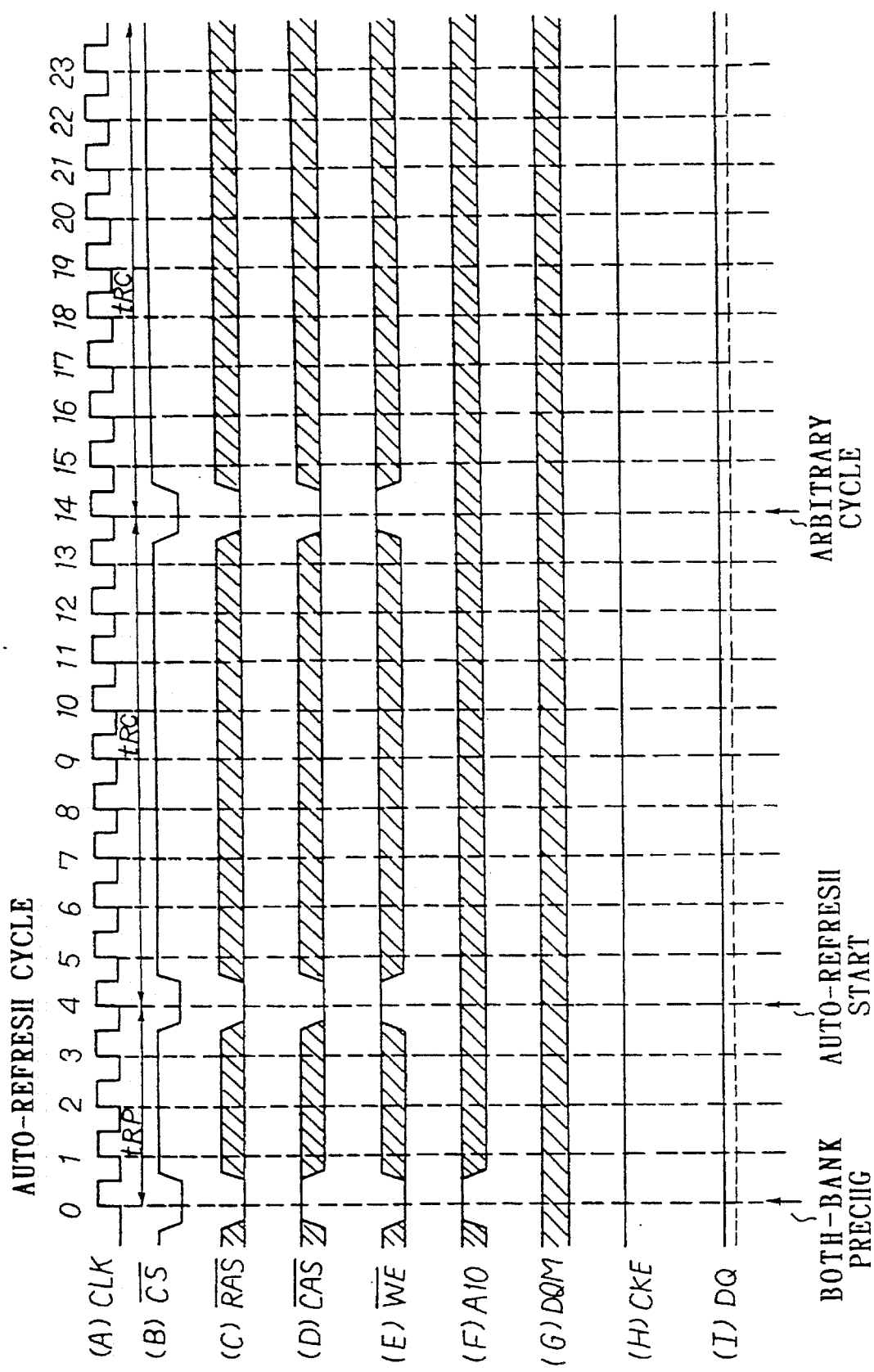
FIG. 6 is a timing chart for assistance in explaining an automatic refresh cycle.

FIG. 6 is a timing chart for explaining the automatic-refresh mode operation of the semiconductor memory device as constructed above. FIG. 6 shows the automatic-refresh cycle executed by a 16M synchronous DRAM, in which (A) denotes the CLK; (B) denotes the /CS; (C) denotes the /RAS; (D) denotes /CAS; (E) denotes the /WE; (F) denotes the A0; (G) denotes the DQM; (H) denotes the CKE; and (I) denotes the DQ, respectively.

As shown in FIG. 6, the both-bank precharge period starts at the rise edge of the clock 0, and the automatic refresh starts at the rise edge of the clock 4. Further, the automatic refresh is executed to the arbitrary cycle determined at the rise edge of the clock 14.

The row system precharge will be described on the basis of Table 2.

There are three cases of the row system precharge as follows: (1) the precharge command is inputted to the device; (2) the device enters the automatic precharge cycle; and (3) the device enters the automatic refresh cycle.

In the case of the input of the precharge command, the precharge command is inputted during a predetermined time period after the row system has been activated, as already explained. When the address latch is not needed due to precharge, the address latch is released for preparation of the succeeding address input. Therefore, the precharge gating circuit must be provided for each bank, in order to prevent one bank from being subjected to the influence of the other banks when the respective banks are activated separately.

On the other hand, when the automatic precharge is designated in the automatic refresh, the precharge starts automatically after the refresh ends. This automatic precharge is designated during the mode setting. The automatic refresh system is also used in the self-refresh. In this case, however, even if the counter test is designated, the automatic precharge must be started automatically after the self-refresh.

Further, when the automatic precharge is designated in the column command cycle, the precharge must be executed at the rise edge of the CLK after the module length access.

On the other hand, in order to save the power consumed by the semiconductor memory device, a power down mode is also prepared.

The power down mode will be described hereinbelow with reference to Table 3.

There are two cases in the power down mode as follows: (1) when the power down mode is designated; and (2) when the device enters the self-refresh.

Figure 7:
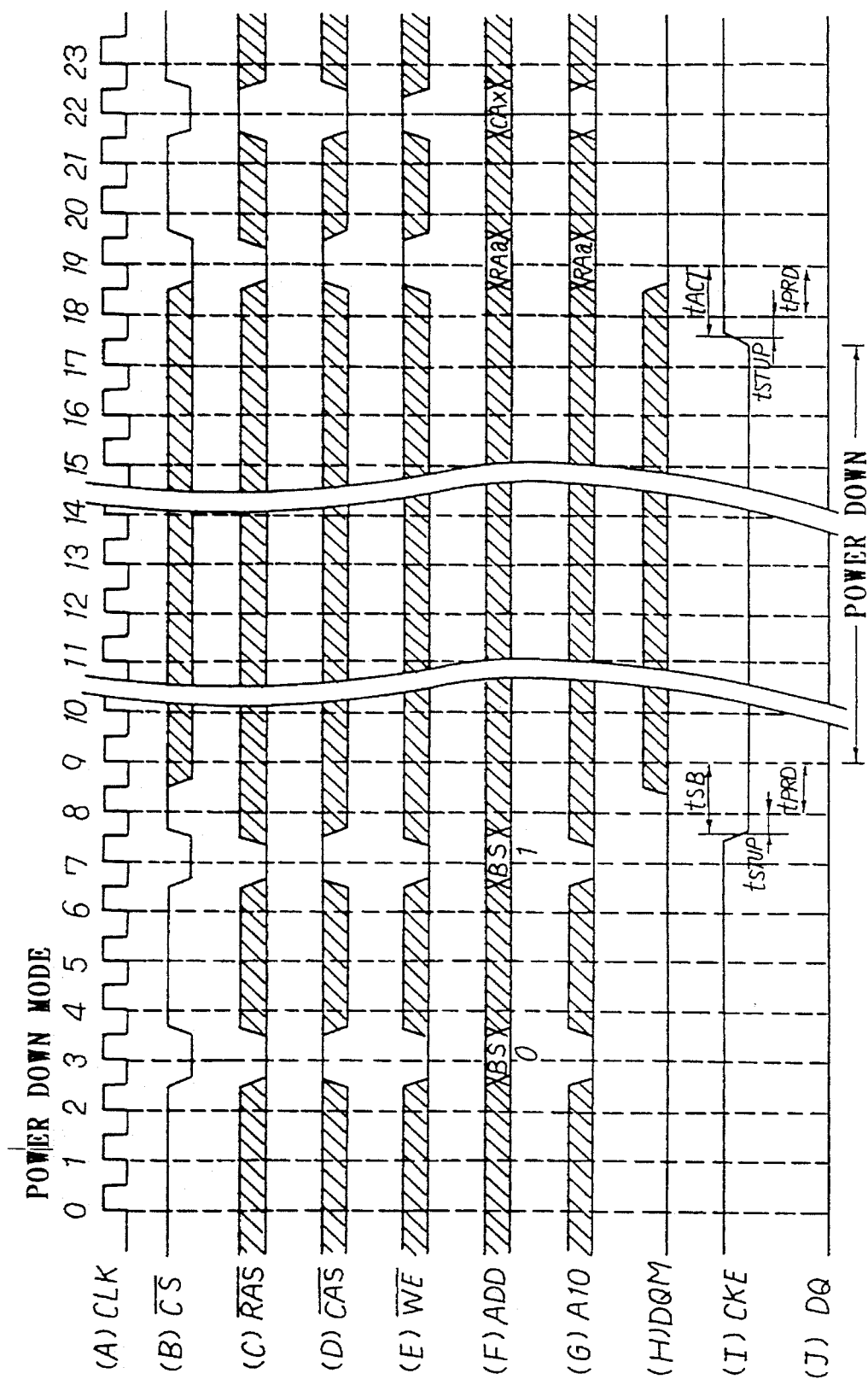
FIG. 7 is a timing chart for assistance in explaining a power down mode.

FIG. 7 is a timing chart for explaining the power down mode of the semiconductor memory device. FIG. 7 shows the power down mode executed by a 16M synchronous DRAM, in which (A) denotes the CLK; (B) denotes the /CS; (C) denotes the /RAS; (D) denotes /CAS; (E) denotes the /WE; (F) denotes the ADD; (G) denotes the address A–O; (H) denotes the DQM; (I) denotes the CKE; and (J) denotes the DQ, respectively.

As shown in FIG. 7, the power down period is between the rise edge of the clock 9 and the fall edge of the clock 17. Further, the entry into the power down mode is executed at the later timing of any of tSB and (tSTUP+ TPRD).

The mode set cycle will be described on the basis of Table 3.

During the mode set cycle, the addresses A0 to BS are acquired to decode the mode. This mode decode can be executed after the access for the module length has been completed.

Figure 8:
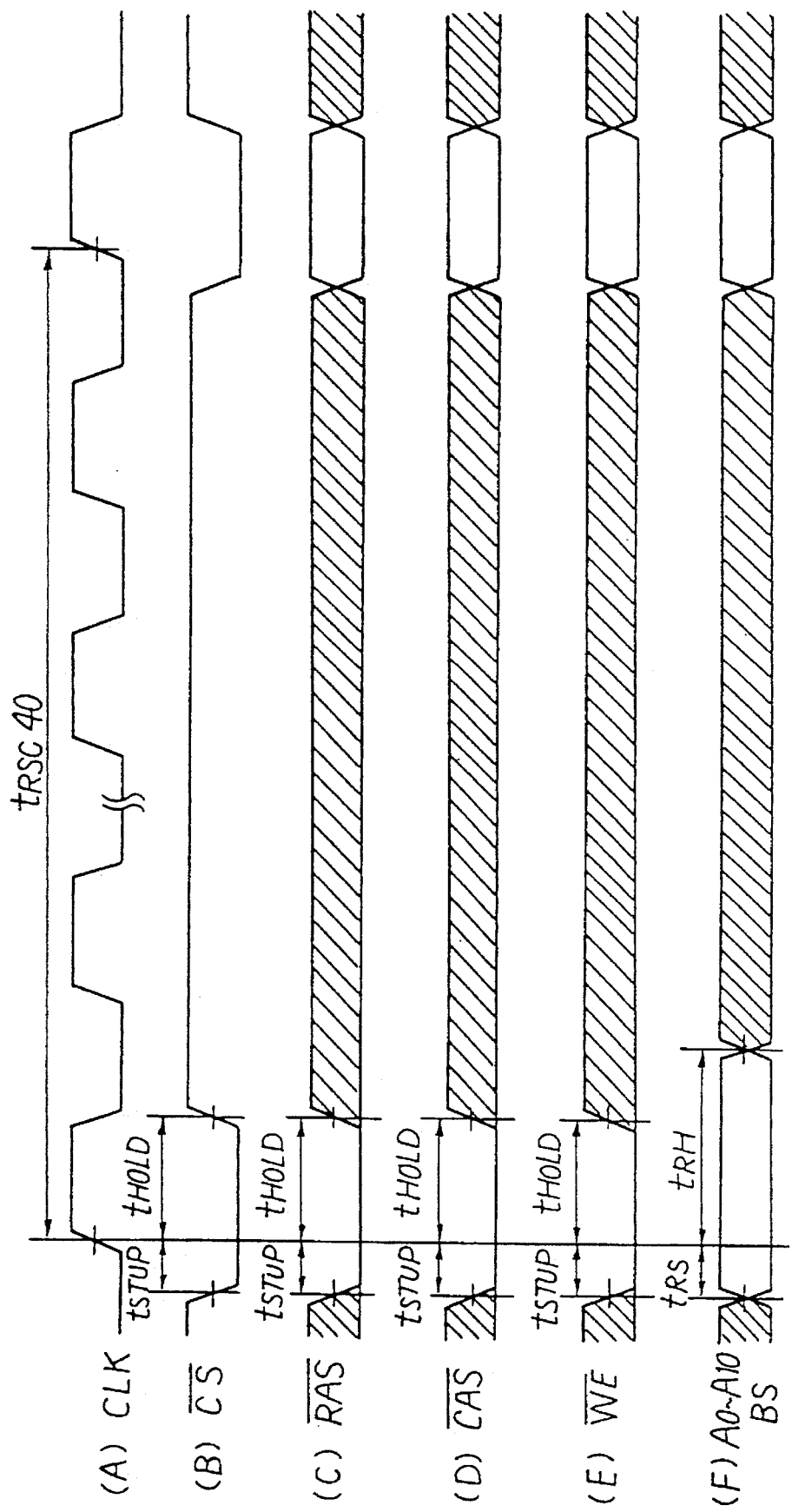
FIG. 8 is a timing chart for assistance in explaining a mode register set cycle.

FIG. 8 is a timing chart for explaining the mode set cycle of the semiconductor memory device. FIG. 8 shows the mode register set cycle, in which (A) denotes the CLK; (B) denotes the /CS; (C) denotes the /RAS; (D) denotes /CAS; (E) denotes the /WE; (F) denotes the addresses A0 to A10 and BS, respectively. As shown in FIG. 8, after the /CS, /RAS, /CAS, /WE, addresses A0 to A10, BS have been switched, the mode set cycle begins after a time tSTUP has elapsed. Therefore, the arbitrary cycle starts after the time tRSC has elapsed.

The circuit configuration of the core section will be described on the basis of Table 4.

The core section circuit is operated by the system for operating the row decoder, the system for operating the word lines, and the system for selecting the sense amplifiers. These system are denoted by a WL system, an R/D system, an RSL system, a K system, respectively in Table 4.

The respective sections shown in FIGS. 2 and 3 will be described in further detail hereinbelow.

The bank activate/precharge detection will be described hereinbelow with reference to Table 5.

The bank activate/precharge designating sections 26 and 27 are activated when a bank activating pulse BACT is inputted. This signal BACT is activated when the automatic precharge or the bank activating command is inputted. Further, the bank is set to the precharge when the bank precharge command is inputted (under the condition that the row precharge gating/RTM is at a high level), or when the automatic refresh /RTM rises, or when the automatic precharge signal is activated to designate the automatic precharge.

Figure 9:
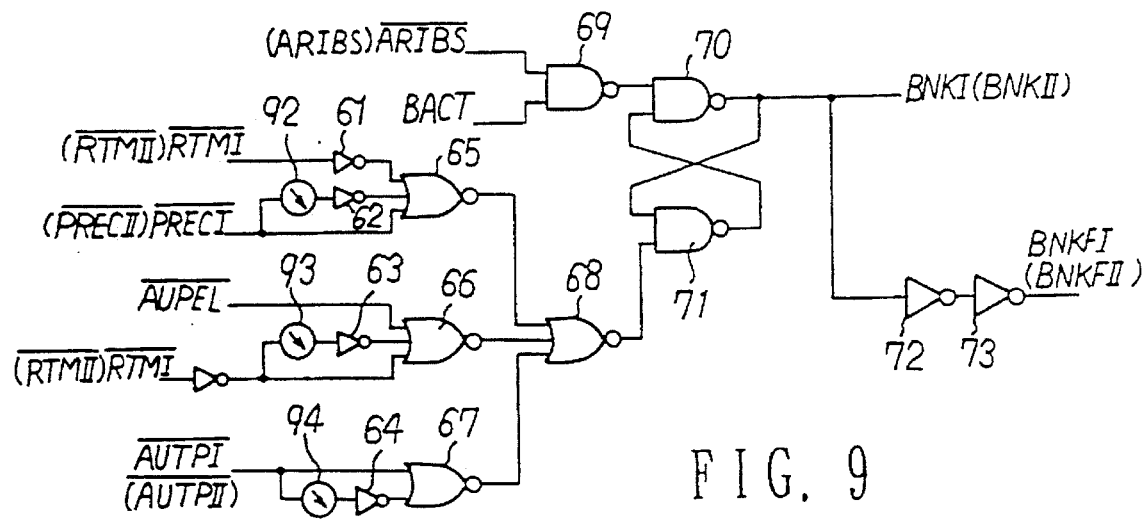
FIG. 9 is a circuit diagram showing a bank activate and/or deactivate designating circuit.
Figure 10:
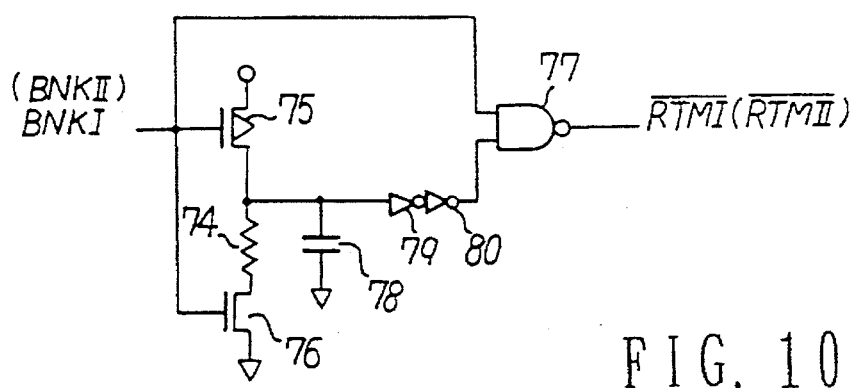
FIG. 10 is a circuit diagram showing a bank precharge gating circuit.
Figure 11:
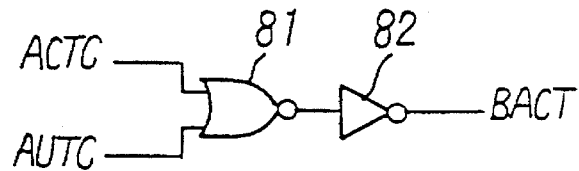
FIG. 11 is a circuit diagram showing a bank activating circuit.

The above-mentioned operation is controlled with the use of the circuits as shown in FIGS. 9, 10 and 11.

FIG. 9 shows the bank activate/deactivate designating circuit, which outputs a BNKI (BNKII) signal and a BNKFI (/BNKFII) signal on the basis of an ARIBS (/ARIBS) signal, a BACT signal, an /RIMI (/RIMII) signal, a /PRECI (/PRECII), an /AUPEL signal, a /RTMI (/RTMII), and an /AUTPI (/AUTPII). Further, in FIG. 9, various output signals can be obtained in combination with the logic by use of inverters 61 to 64, NOR gates 65 to 67, NAND gates 69 to 71, inverters 72 and 73, and time constant circuits 92 to 94, respectively.

FIG. 10 shows the bank precharge gating circuit, which outputs an/RTMI (/RTMII) signal on the basis of the BNKI (BNKII) signal. As shown in FIG. 10, the BNKI (BNKII) signal is inputted to the gates of a P-channel MOS transistor 75 and an N-channel MOS transistor 76 (both drains of which are connected to each other by a resistance 74) and to an NAND gate 77. The drain of the transistor 75 is connected to a series-connected inverters 77 and 78 via a line grounded through a capacitor 78. The output of the inverter 80 is given to the NAND gate 77, and the NAND gate 77 outputs an /RTMI (/RTMII) signal.

FIG. 11 shows a bank activating circuit. In FIG. 11, an ACTC signal and an AUTO signal are inputted to a NOR gate 81, and the output of the NOR gate 81 is outputted via an inverter 82 to obtain a BACT signal.

The detection of the ACT command will be described hereinbelow with reference to Table 6.

After the bank active command has been detected, a bank activate pulse is outputted to latch the output of the row address buffer. These latch operations are executed by circuits as shown in FIGS. 11, 12, 13 and 14.

Figure 12:
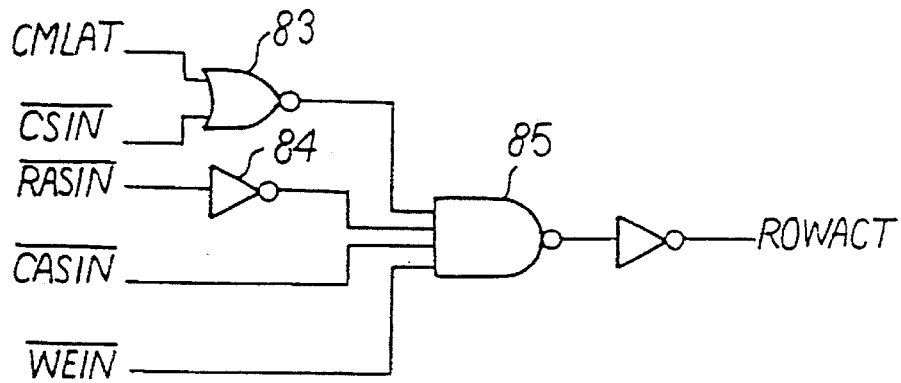
FIG. 12 is a circuit diagram showing a band activate command detecting circuit.

FIG. 12 shows the bank activate command detecting circuit. As shown in FIG. 12, an ROWACT signal can be outputted on the basis of a CMLAT signal, a /CSIN signal, an /RASIN signal, a /CASIN signal, and a /WEIN signal. That is, the CMLAT signal and the /CSIN signal are inputted to a NAND gate 85 via an inverter 84, and the /CASIN signal and the/WEIN signal are directly inputted to the NAND gate 85. The output of the NAND gate 85 is outputted via an inverter 86 as an ROWACT signal.

Figure 13:
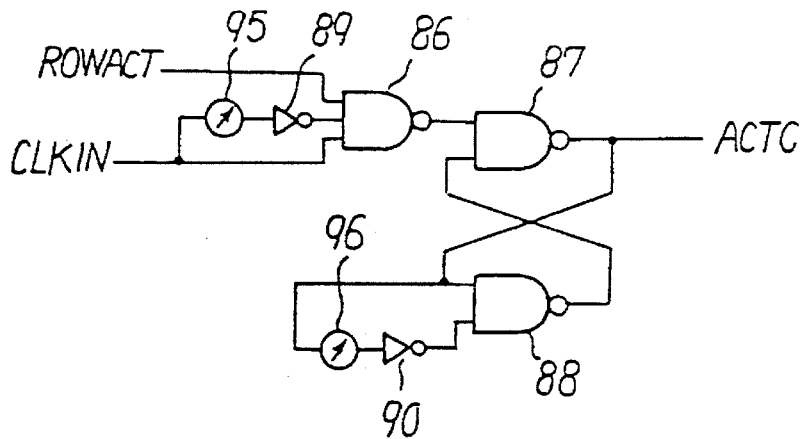
FIG. 13 is a circuit diagram showing a band activate command pulse generating circuit.

FIG. 13 shows the bank activate command generating circuit. As shown in FIG. 13, an ACTC signal is outputted on the basis of the ROWACT signal and a CLKIN signal. This circuit is composed of NAND gates 86 to 88, inverters 89 and 90 and time constant circuits 95 and 96.

Figure 14:
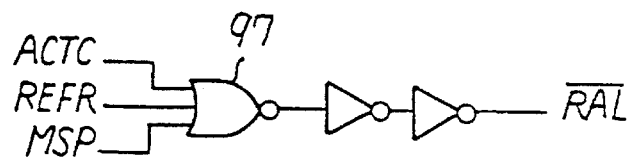
FIG. 14 is a circuit diagram showing an address latch circuit.

FIG. 14 shows the row address latch circuit. An ACTC signal, an REFR signal and an MSP signal are inputted to a NOR gate 97. The output of the NOR gate 97 is obtained via series-connected inverters 98 and 99 as an /RAL signal.

The respective bank addresses are latched by activating the bank, and the latch is released by precharging the bank. These operation can be executed by the bank address latch circuit as shown in FIG. 15.

Figure 15:
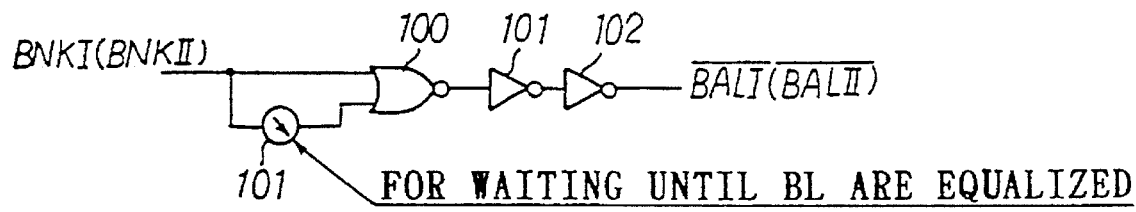
FIG. 15 is a circuit diagram showing a bank address latch circuit.

In FIG. 15, the BNKI (BNKII) signal is inputted directly to a NOR gate 100 and further inputted to the same NOR gate 100 via a time constant circuit 101. The output of the NOR gate 101 is outputted via inverters 102 and 103 as a /BALI (BALII) signal. Here, the time constant circuit 101 serves to wait the signal until the BL (bit lines) are equalized.

Figure 16:
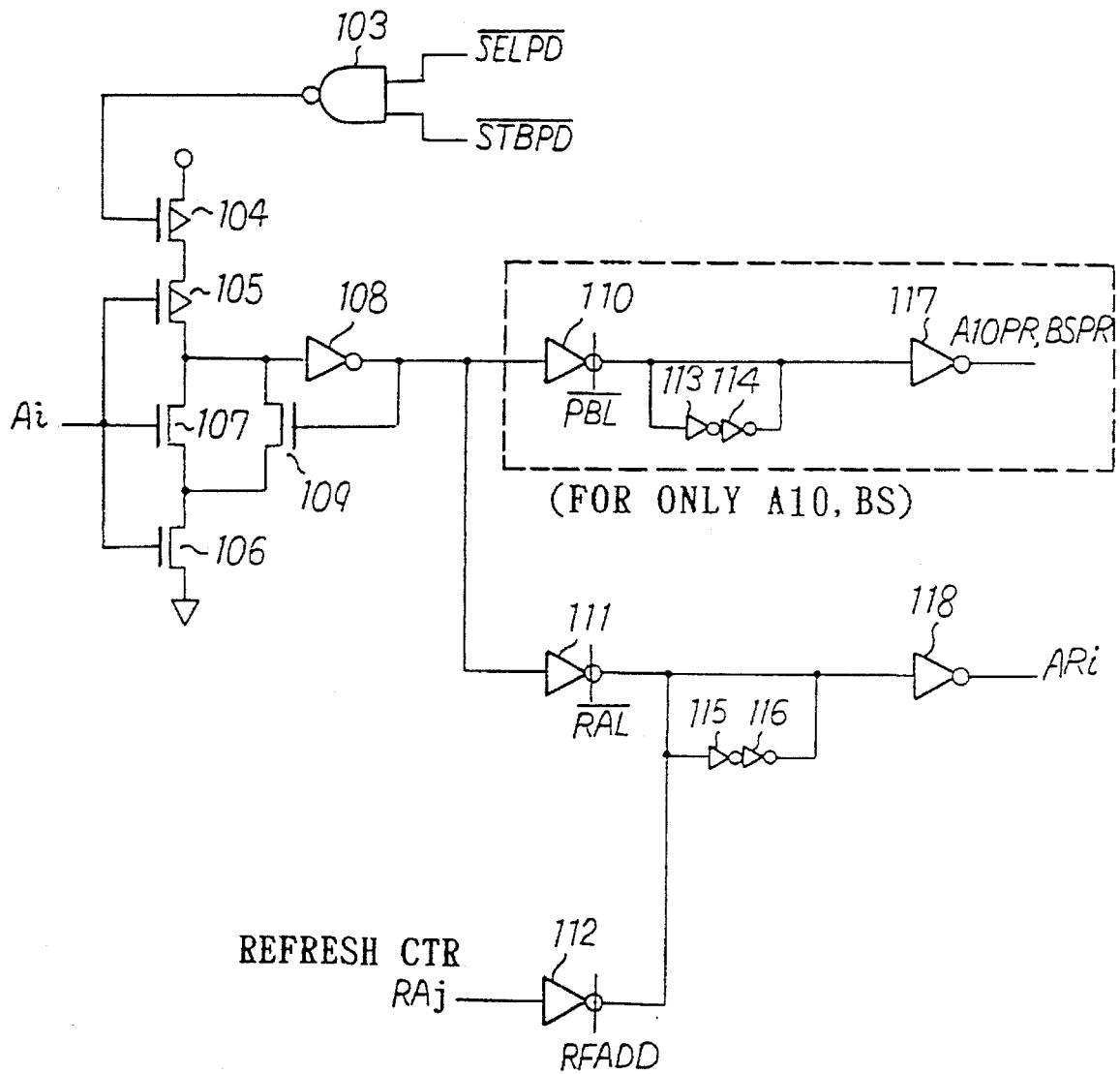
FIG. 16 is a circuit diagram showing a row address buffer circuit.

As shown in FIG. 16, the output of the row address buffer is outputted as a core section address designating output ARi, and a precharge designating output A1OPR and BSPR. Here, FIG. 16 shows the row address buffer circuit. An /SELPD signal and an /STBPD signal are inputted to the gate of a P-channel MOS transistor 104 via a NAND gate 103. An address Ai is inputted to the gates of a P-channel MOS transistor 105 and N-channel MOS transistors 106 and 107. The drains of the transistors 105 and 107 are outputted via an inverter 108 to the gate of an N-channel MOS transistor 109 connected in parallel to the transistor 107. The output of the inverter 108 is also inputted to clocked inverters 110 and 111. On the other hand, an RAj signal of the refresh counter is inputted to a clocked inverter 112. Here, the clocked inverter 110 is clocked-operated by a /PBL signal, the clocked inverter 112 is clocked-operated by an RFADD signal. The output of the clocked inverter 110 is inputted to an inverter 117 via a route through inverters 113 and 114 and via a direct route, so that A1OPR and BSPR signals can be obtained. Further, the outputs of the clocked inverters 111 and 112 are inputted to an inverter 118 via a route through inverters 115 and 116 and via a direct route so that an ARi signal can be obtained. Here, the system including the clocked inverter 110 is incorporated only in the system including A1O and BS.

The automatic refresh detection will be described hereinbelow with reference to Table 7.

The automatic refresh detection signal is activated when the automatic refresh command is inputted and the self-refresh period designating counter is activated. Once the automatic refresh detection signal is activated, the bank is also activated. In the automatic refresh, since the output of the refresh counter is used, the output of the address buffer is stopped. Further, when the automatic precharge is designated, the precharge starts at the rise edge of the /RTM signal. In the counter test, since it is not clear which bank is internally activated, the bank activated by the counter is set to the column active status automatically.

The following operation can be realized by the circuits as shown in FIGS. 17 to 25.

Figure 17:
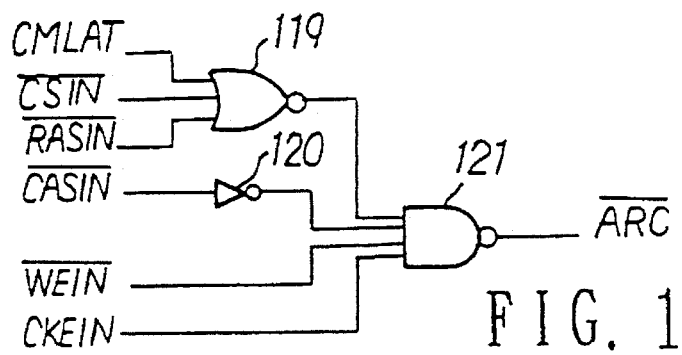
FIG. 17 is a circuit diagram showing an automatic refresh command detecting circuit.

FIG. 17 shows the automatic refresh command detecting circuit. The CMLAT signal, /CSIN signal and /RASIN signal are inputted to a NAND gate 121 via a NOR gate 119. The /CASIN signal is inputted to the NAND gate 121 via an inverter 120. The /WEIN signal and CKEIN signal are inputted to the NAND gate 121 directly. The NAND gate 121 outputs an /ARC signal.

Figure 18:
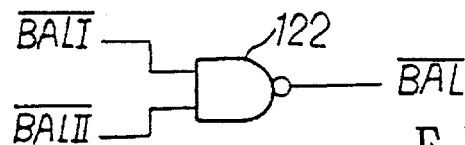
FIG. 18 is a circuit diagram showing a both-bank precharge detecting circuit.

FIG. 18 shows the both-bank precharge detecting circuit. The /BALI signal and /BALII signal are applied to a NAND gate 122 to obtain a /BAL output signal.

Figure 19:
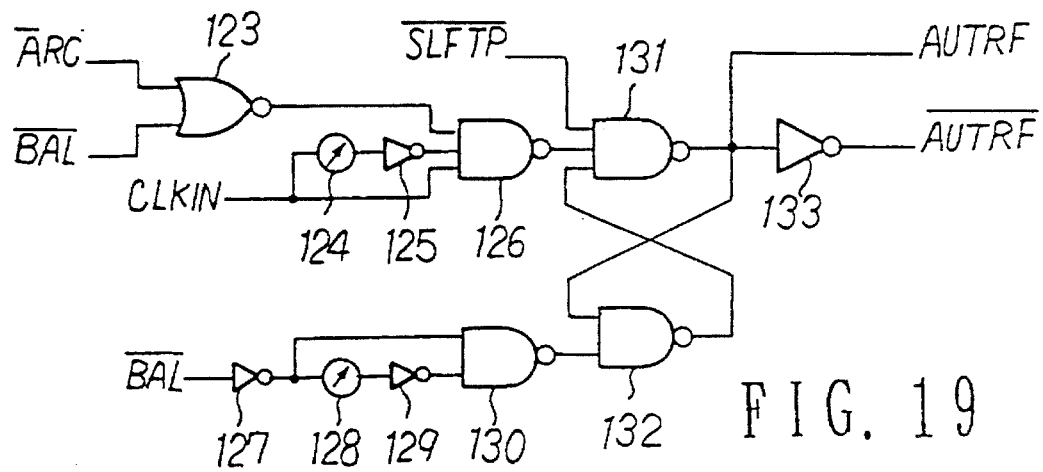
FIG. 19 is a circuit diagram showing an automatic refresh designating circuit.

FIG. 19 shows the automatic refresh designating circuit. The /ARC signal and /BAL signal are inputted to a NOR gate 123. The CLKIN signal is inputted to a time constant circuit 124 and a NAND gate 126. The /BAL signal is inputted to an inverter 127. The /SLFTP signal is inputted to a NAND gate 131. The output of the NOR gate 123 is connected to the NAND gate 126, the output of the time constant circuit 124 is connected to the NAND gate 126 via an inverter 125, and the output of the NAND gate 126 is connected to the NAND gate 131. On the other hand, the output of the inverter 127 is given to the NAND gate 130 and the time constant circuit 128, the output of the time constant circuit 128 is given to the NAND gate 130 via the inverter 129, and the output of the NAND gate 130 is given to the NAND gate 132. The output of the NAND gate 131 is connected to the input of the NAND gate 132, and the output of the NAND gate 132 is connected to the input of the NAND gate 131, respectively. The output of the NAND gate 131 is derived as an AUTRF signal. On the other hand, the output of the NAND gate 131 is outputted via an inverter 133 as an /AUTRF signal.

Figure 20:
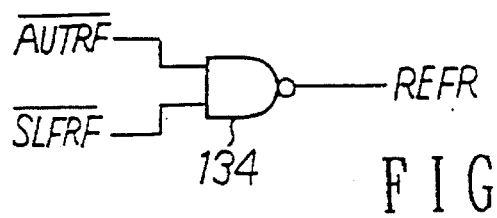
FIG. 20 is a circuit diagram showing a refresh state detecting circuit.

FIG. 20 shows a refresh status detecting circuit. The /AUTRF signal and /SLFRF signal are inputted to a NAND gate 134 to obtain an REFR signal.

Figure 21:
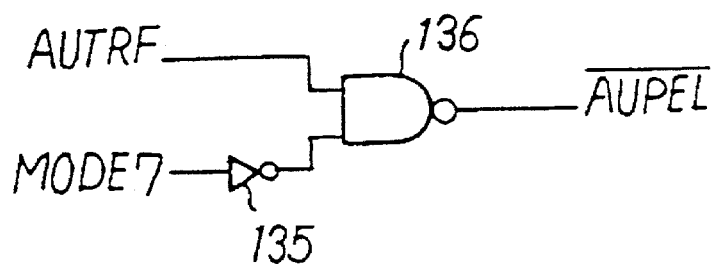
FIG. 21 is a circuit diagram showing an automatic refresh precharge designating circuit.

FIG. 21 shows the automatic refresh precharge designating circuit. The AUTRF signal is directly inputted to a NAND gate 136 and the MODE7 signal is inputted to the NAND gate 136 via an inverter 135, so that an /AUPEL signal can be obtained.

Figure 22:
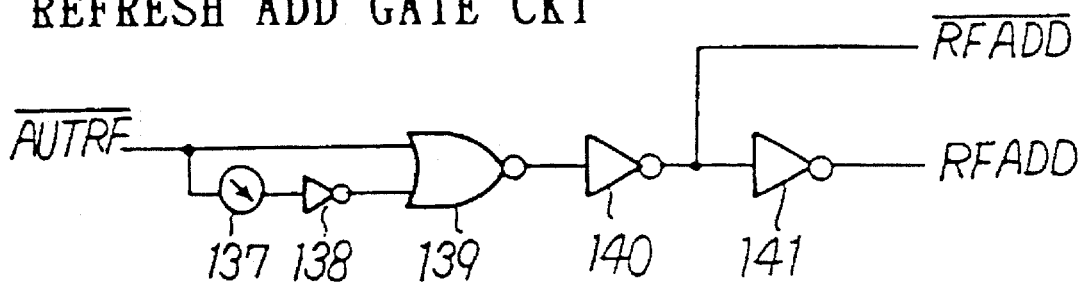
FIG. 22 is a circuit diagram showing a refresh address gating circuit.

FIG. 22 shows the refresh address gate circuit. The /AUTRF signal is inputted to a NOR gate 139 directly and further via a time constant circuit 137 and an inverter 138. The output of the NOR gate 139 is outputted via an inverter 140 to obtain an /RFADD signal. Further, the output of the inverter 140 is inverted by an inverter 141 to obtain an RFADD signal.

Figure 23:
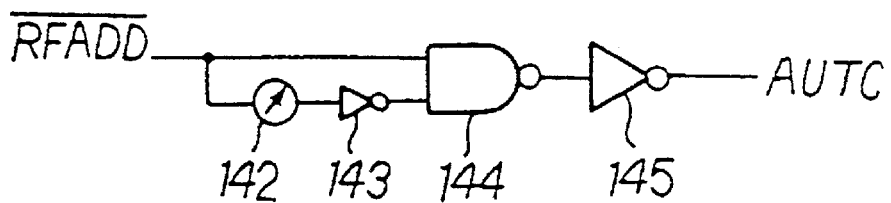
FIG. 23 is a circuit diagram showing a refresh bank activating circuit.

FIG. 23 shows the refresh bank activating circuit. The /RFADD signal is inputted to a NAND gate 144 directly and via a time constant circuit 142 and an inverter 143. The output of the NAND gate 144 is outputted via an inverter 145 to obtain an AUTO signal.

Figure 24:
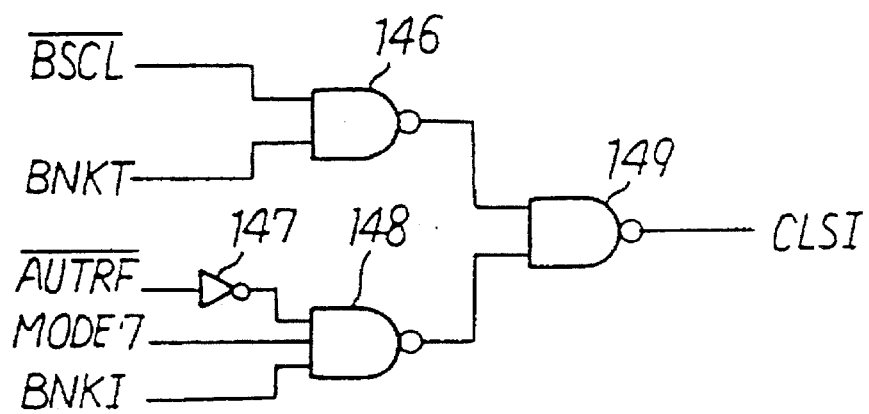
FIG. 24 is a circuit diagram showing a column system selecting circuit for counter test.
Figure 24:
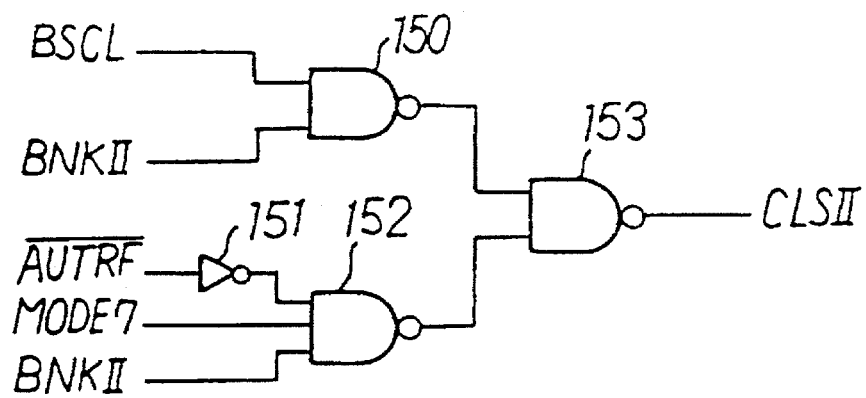
Figure 25:
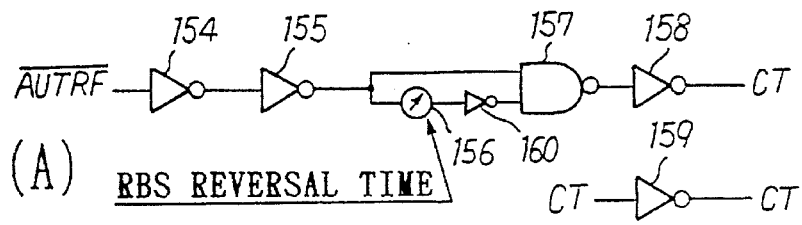
FIG. 25(A) is a circuit diagram showing a refresh counter circuit.
FIG. 25(B) is a circuit diagram showing an Rj signal generating circuit.
FIG. 25(C) is a diagram showing how to connect a counter.
Figure 25:
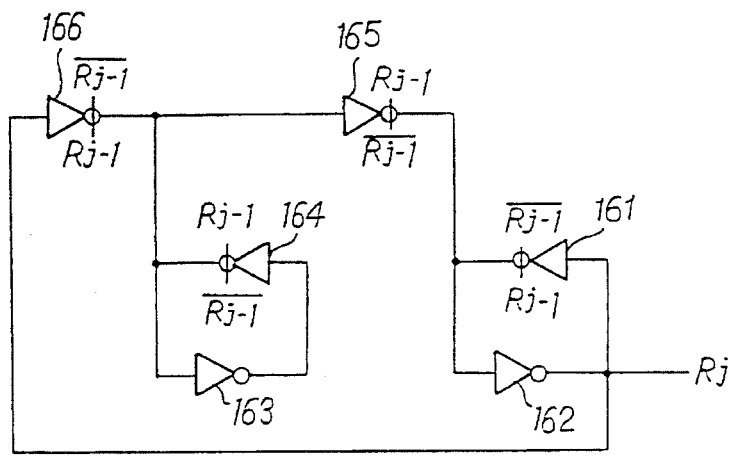
Figure 25:

FIG. 24 shows the counter test corresponding the column system selecting circuit. As shown, the /BSCL signal and BNKI signal are inputted to a NAND gate 149 via a NAND gate 146. The /AUTRF signal is inputted to a NAND gate 148 via an inverter 147. The MODE7 signal and BNKI signal are inputted to the NAND gate 148. The output of the NAND 148 is inputted to a NAND gate 149 to obtain a CLSI signal. On the other hand, the BSCL signal and BNKII signal are inputted to a NAND gate 153 via a NAND gate 150. The /AUTRF signal is inputted to a NAND gate 152 via an inverter 151. The MODE7 signal and BNKII signal are inputted to the NAND gate 152. The output of the NAND 152 is inputted to a NAND gate 153 to obtain a CLSII signal.

FIGS. 25(A) and (B) show the refresh counter circuit. As shown, the /AUTRF signal is inputted to a NAND gate 157 and a time constant circuit 156 via inverters 154 and 155. The output of the time constant circuit 156 is applied to a NAND gate 157 via an inverter 160. The output of the NAND gate 157 is outputted via an inverter 158 as a CT signal. The CT signal is inverted by an inverter 159 as a /CT signal. The time constant of the time constant circuit 156 is set to a time length in which the RBS signal is inverted.

The Rj signal is obtained as an output of an inverter 162. The output of the inverter 162 is applied to a clocked inverter 166, and further returned to the input side of the inverter 162 via a clocked inverter 161. The output of the clocked inverter 166 is connected to an inverter 163 and a clocked inverter 165. The output of the inverter 163 is returned to the input side of the inverter 163 via a clocked inverter 164. The output of the clocked inverter 165 is given to the inverter 162. Here, the clocked inverters 161 and 166 are operated so as to gate the signal on the basis of an /(Rj-1) signal. The clocked inverters 164 and 165 are operated so as to gate the signal on the basis of the (Rj-1) signal. Further, the RBS-1 signal corresponds to the CT signal, and the /(RBS-1) signal corresponds to the /CT signal.

As shown in FIG. 25(C), the CT signal is given to the BS stage of the counter connected in series beginning from the BS stage in the order of the 0-th stage, the 1-st stage, . . . , the 10-th stage.

The self-refresh detection, the precharge command detection and the automatic precharge bank detection will be described hereinbelow with reference to Table 8.

The self-refresh can be realized by forming a refresh period with a counter and by executing the automatic refresh for each period. For realization of the operation, the circuits as shown in FIGS. 26 to 29 are used.

Figure 26:
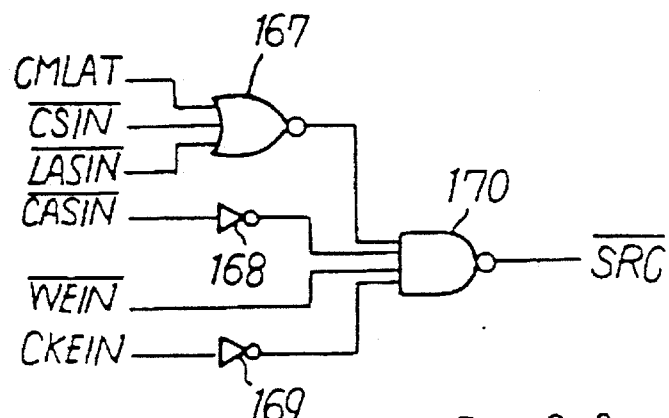
FIG. 26 is a circuit diagram showing a self-refresh command detecting circuit.

FIG. 26 shows the self-refresh command detecting circuit. As shown, the CMLAT signal, the /CSIN signal and the /RASIN signal are inputted to a NAND gate 170 via a NOR gate 167. On the other hand, the /CASIN signal is inputted to a NAND gate 170 via an inverter 168. The /WEIN signal is inputted to the NAND gate 170 directly. The CKEIN signal is inputted to the NAND gate via an inverter 169. The NAND gate 170 outputs an /SRC signal.

Figure 27:
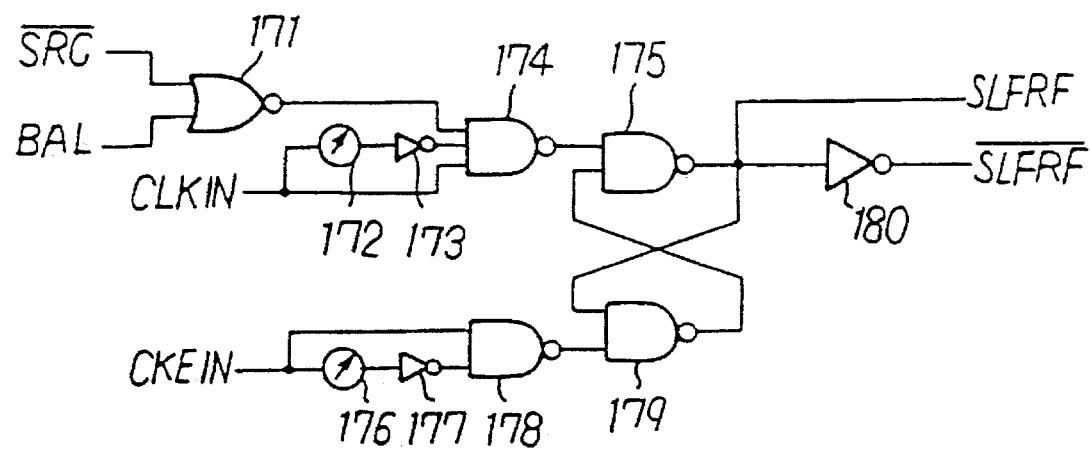
FIG. 27 is a circuit diagram showing a self-refresh designating circuit.

FIG. 27 shows the self-refresh designating circuit. As shown, the /SRC signal and /BAL signal are inputted to a NOR gate 171. The CLKIN signal is inputted to a time constant circuit 172 and a NAND gate 174. The CKE signal is inputted to a time constant circuit 176 and a NOR gate 178. The output of the time constant circuit 172 is inputted to a NAND gate 174 via an inverter 173. The output of the time constant circuit 176 is inputted to an NAND gate 178 via an inverter 177. The output of the NOR gate 171 is given to the NAND gate 174. The output of the NAND gate 174 is given to an NAND gate 175. The output of the NAND gate 178 is given a NAND gate 179. The output of the NAND gate 179 is connected to the input of the NAND gate 175. The NAND gate 175 outputs the SLFRF signal. Further, this signal is inverted by an inverter 180 to obtain an /SLFRF signal.

Figure 28:
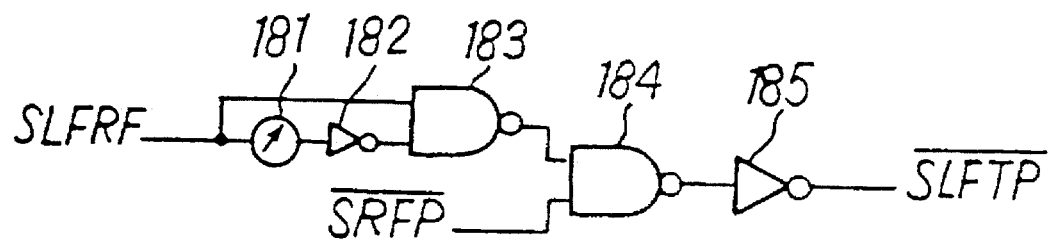
FIG. 28 is a circuit diagram showing a self-refresh timing pulse generating circuit

FIG. 28 shows the self-refresh timing pulse generating circuit. As shown, the SLFRF signal is applied to a time constant circuit 181 and a NAND gate 183. The output of the time constant circuit 181 is inputted to a NAND gate 183 via an inverter 182. The output of the NAND gate 183 is given to a NAND gate 184. Further, the /SRFP signal is applied to the NAND gate 184. The output of the NAND gate 184 is outputted via an inverter 185 as an /SLFTP signal.

Figure 29:
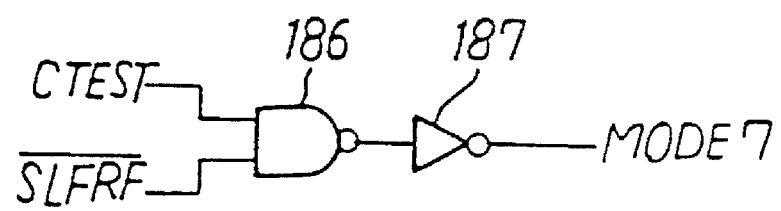
FIG. 29 is a circuit diagram showing a self-forced precharge designating circuit.

FIG. 29 shows the self-forced precharge designating circuit. As shown, the CTEST signal and /SLFRF signal are inputted to a NAND gate 186, and further inverted by an inverter 187 to obtain an MODE7 signal.

The designated bank is precharged when the precharge command is inputted. In this case, it is necessary to separate the portion for latching A10 and BS for bank designation from the activated portion, so as to correspond to the activation command inputted in response to the succeeding clock CLK. The above-mentioned operation can be executed by the circuits as shown in FIGS. 30 to 33.

Figure 30:
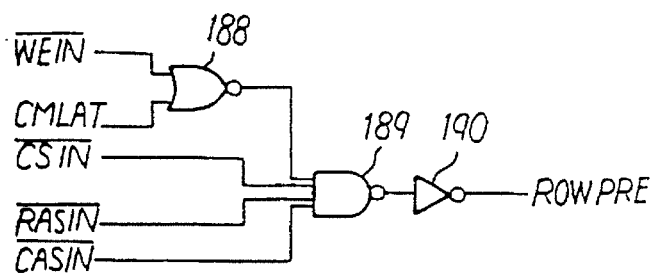
FIG. 30 is a circuit diagram showing a precharge command detecting circuit.

FIG. 30 shows a precharge command detecting circuit. As shown, the /WEIN signal and CMLAT signal are inputted to a NOR gate 188. The /CSIN signal, /RASIN signal, and /CASIN signal are inputted to a NAND gate 189 together with the output of the NOR gate 188. The output of the NAND gate 189 is outputted via an inverter 190 as an ROWPRE signal.

Figure 31:
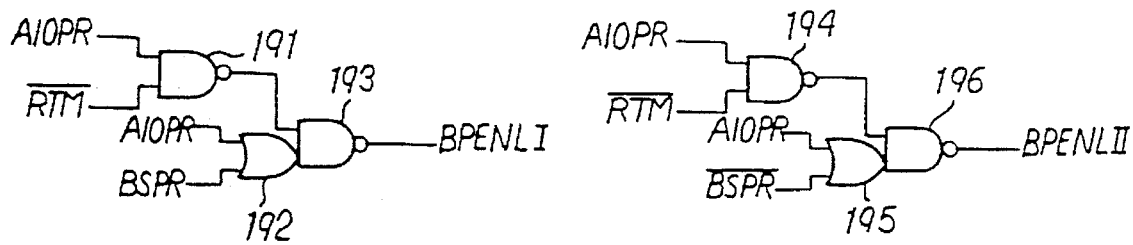
FIG. 31 is a circuit diagram showing a precharge bank detecting circuit.

FIG. 31 shows a precharge bank detecting circuit. As shown, the A10PR signal and /RTM signal are inputted to a NAND gate 191. The A1OPR signal and BSPR signal are inputted to an OR gate 192. The outputs of the NAND gate 191 and the OR gate 192 are given to a NAND gate 193 to obtain a BPENLI signal. Further, the A1OPR signal and /RTM signal are inputted to a NAND gate 194. The A1OPR signal and /BSPR signal are inputted to an OR gate 195. The outputs of the NAND gate 194 and the OR gate 195 are given to a NAND gate 196 to obtain a BPENLII signal.

Figure 32:
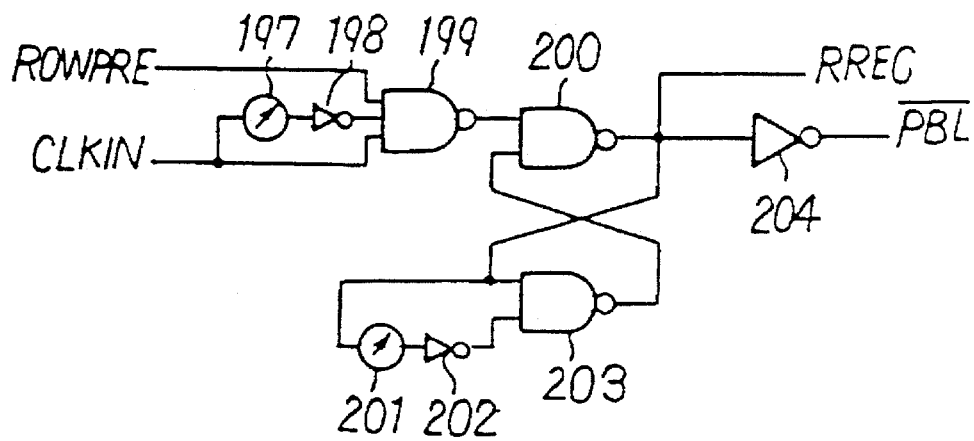
FIG. 32 is a circuit diagram showing a bank precharge command pulse generating circuit.

FIG. 32 shows the bank precharge command generating circuit. As shown, the ROWPRE signal is given to a NAND gate 199. The CLKIN signal is inputted to the NAND gate 199 and a time constant circuit 197. The output of the time constant circuit 197 is inputted to the NAND gate 199 via an inverter 198. The output of the NAND gate 199 is inputted to a NAND gate 200. The output of the NAND gate 200 is inputted to a NAND gate 203. The output of the NAND gate 203 is inputted to the NAND gate 200. On the other hand, the output of the NAND gate 200 is inputted to a NAND gate 203 via a time constant circuit 201 and an inverter 202. The output of the NAND gate 200 is outputted as the PREC signal, and inverted by an inverter 204 to obtain a /PREC signal.

Figure 33:
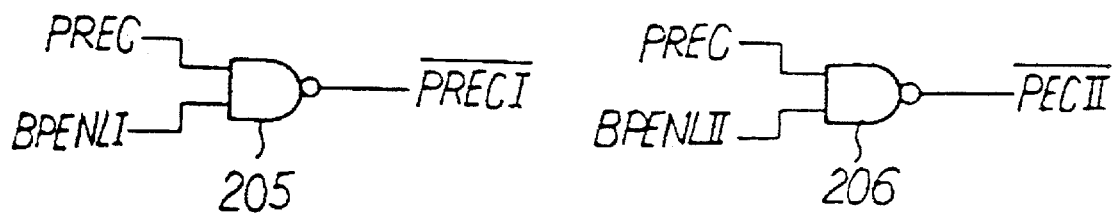
FIG. 33 is a circuit diagram showing a bank precharging circuit.

FIG. 33 shows the bank precharge circuit. As shown, the PREC signal and BPENLI signal are applied to a NAND gate 205 to output the /PRECI signal. On the other hand, the PREC signal and BPENLII signal are applied to a NAND gate 206 to output a /PRECII signal.

Figure 34:
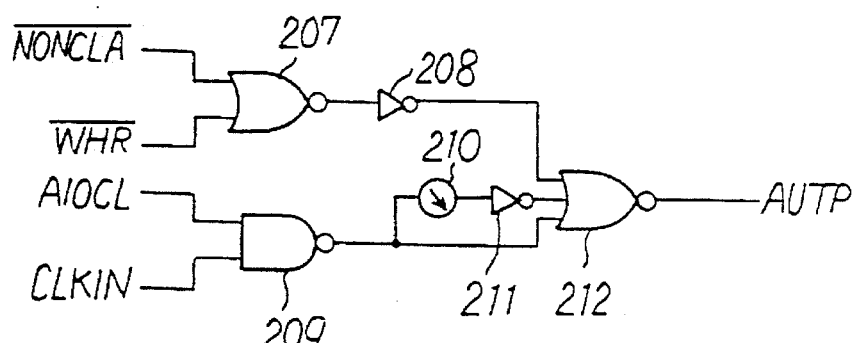
FIG. 34 is a circuit diagram showing an automatic precharge detecting circuit.
Figure 35:
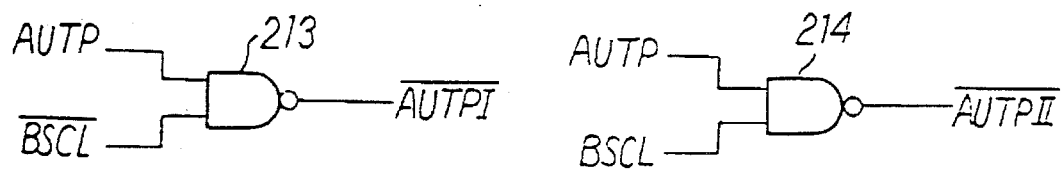
FIG. 35 is a circuit diagram showing an automatic precharge bank designating circuit.

Further, the automatic precharge in the column access mode is executed by the circuits as shown in FIGS. 34 and 35.

FIG. 34 shows the automatic precharge detecting circuit. As shown, the /NONCLA signal and /WMR signal are given to a NOR gate 207. The A1OPR signal and CLKIN signal are given to a NAND gate 209. The output of the NOR gate 207 is inputted to a NOR gate 212 via an inverter 208, and the output of a NAND gate 209 is inputted to the NOR gate 212 and a time constant circuit 202. The output of the time constant circuit 202 is given to the NOR gate 212 via an inverter 211. As a result, the NOR gate 212 outputs an AUTP signal.

FIG. 35 shows the automatic precharge bank designating circuit. As shown, the AUTP signal and /BSCL signal are given to a NAND gate 213 to obtain an /AUTPI signal. The AUTP signal and BSCL signal are given to a NAND gate 214 to obtain an /AUTPII signal.

The power down mode will be described hereinbelow with reference to Table 9.

Figure 36:
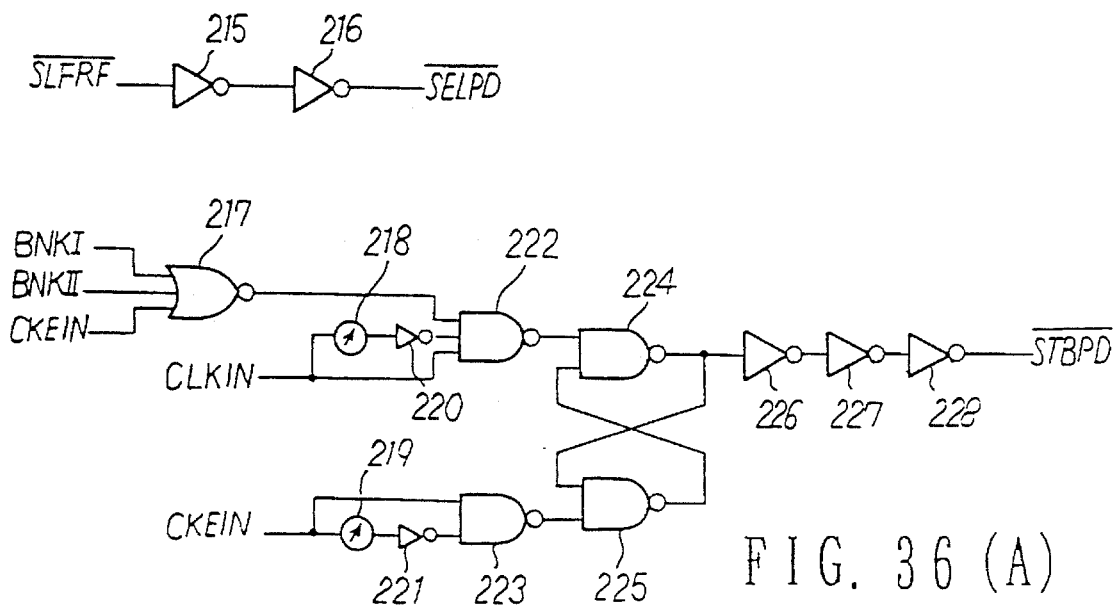
FIG. 36(A) is a circuit diagram showing a circuit diagram showing a power down circuit.
FIG. 36(B) is a logical table thereof.

The power down mode is designated when all the banks are in the precharged conditions and further the CKE signal is at the row level. Upon start of this mode, the Schmitt trigger of the external signal input stage is stopped, without stopping the CKE signal and the CLK signal. Further, upon start of the self-refresh, all the input stages other than the CKE signal are stopped. The above-mentioned operation can be executed by the circuits as shown in FIGS. 36(A) and (B). FIG. 36(A) shows the power down circuit, and FIG. 36(B) lists the destinations of the power down signals. As shown in FIG. 36(A), the /SLFRF signal is outputted through series-connected inverters 215 and 216 as an /SELPD signal. On the other hand, the BNKI signal, BNKII signal and CKEIN signal are inputted to a NOR gate 217. Further, the CLKIN signal is inputted to a time constant circuit 218 and a NOR gate 222. The CKEIN signal is inputted to a time constant circuit 219 and a NAND gate 223. The output of the NOR gate 217 is inputted to the NAND gate 222. The output of the time constant circuit 218 is inputted to the NAND gate 222 via an inverter 220. On the other hand, the output of the time constant circuit 219 is inputted to a NAND gate 223 via an inverter 221. The output of the NAND gate 222 is outputted to a NAND gate 224 and the output of the NAND gate 223 is outputted to a NAND gate 225. The output of the NAND gate 224 is inputted to a NAND gate 225, and the output of the NAND gate 225 is inputted to the NAND gate 224, respectively. The output of the NAND gate 224 is outputted via series-connected inverters 226, 227 and 228 as an /STBPD signal.

Further, the destinations of the power down signals /SELPD and /STBPD are listed in FIG. 36(B).

The mode register set cycle will be described hereinbelow with reference to Tables 10 and 11.

The operation mode of the synchronous DRAM is designated on the basis of the addresses A0 to BS during the mode set cycle.

In Table 11, (A) denotes a module length mode; (B) denotes a scramble mode; (C) denotes a latency mode; (C) denotes a test mode; and (E) denotes a mode change mode, respectively. Here, the latency implies the number of clock signals from when a command is inputted to when data are transferred in the synchronous memory device.

The address acquired as the operation mode is latched by a mode register. In this case, however, the counter test designation must be changed to the automatic precharge designation forcedly in the self-refresh by circuits as shown in FIGS. 37 to 44.

Figure 37:
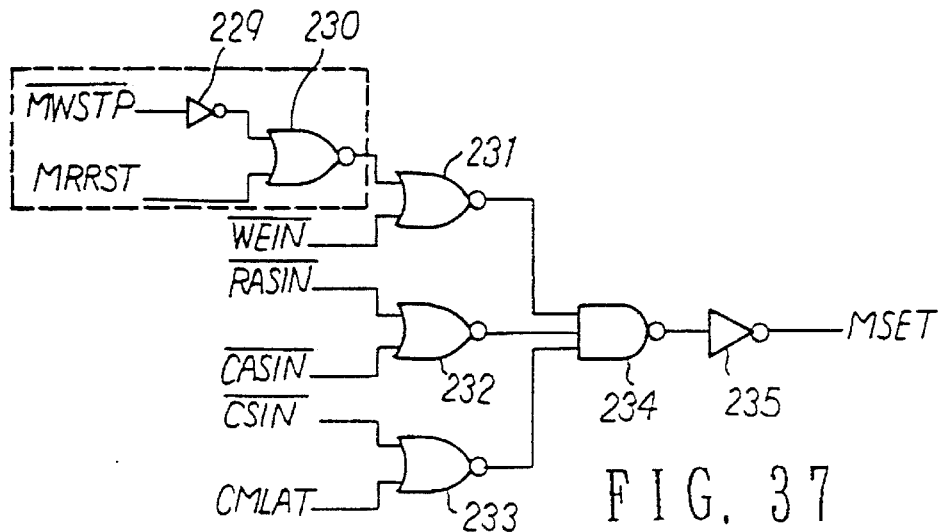
FIG. 37 is a circuit diagram showing a mode change detecting circuit.

FIG. 37 shows a mode change detecting circuit. As shown, the /MWSTP signal is inputted to a NOR gate 230 via an inverter 229, and the MRRST signal is inputted directly to the NOR gate 230. The /WEIN signal is inputted to a NOR gate 231, the /RASIN signal and /CASIN signal are inputted to a NOR gate 232, and the /CSIN signal and CMLAT signal are inputted to a NOR gate 233, respectively. The respective outputs of the NOR gates 231, 232 and 233 are given to a NAND gate 234 and then outputted via an inverter 235 as an MSET signal.

Figure 38:
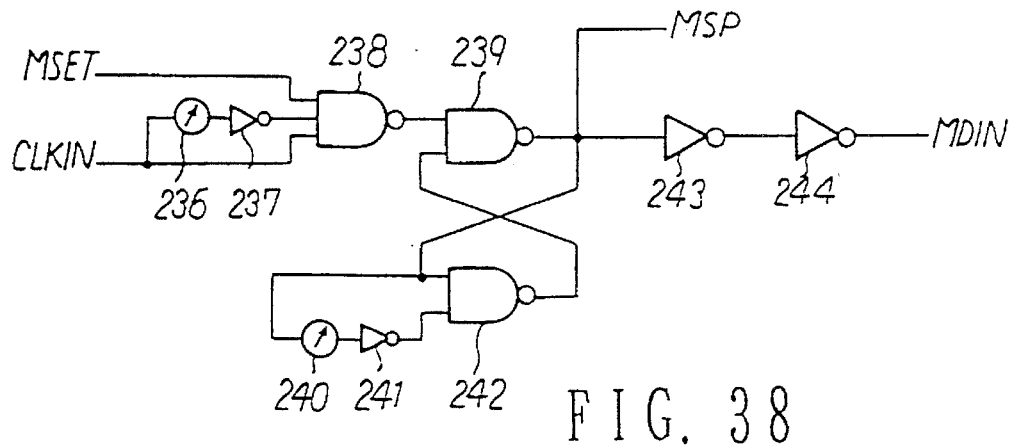
FIG. 38 is a circuit diagram showing a mode address acquiring circuit.

FIG. 38 shows the mode address acquiring circuit. As shown, the MSET signal is inputted to a NAND gate 238, and the CLKIN signal is inputted to the NAND gate 238 and a time constant circuit 236. The output of the time constant circuit 236 is inputted to a NAND gate 238 via an inverter 237. The output of the NAND gate 238 is inputted to a NAND gate 239. The output of the NAND gate 239 is inputted to a NAND gate 242 and a time constant circuit 240. The output of the time constant circuit 240 is inputted to the NAND gate 242 via an inverter 241. The output of the NAND gate 242 is given to a NAND gate 239. The output of the NAND gate 239 is outputted as an MSP signal. The output of the NAND gate 239 is outputted via two inverters 243 and 244 as an MDIN signal.

Figure 39:
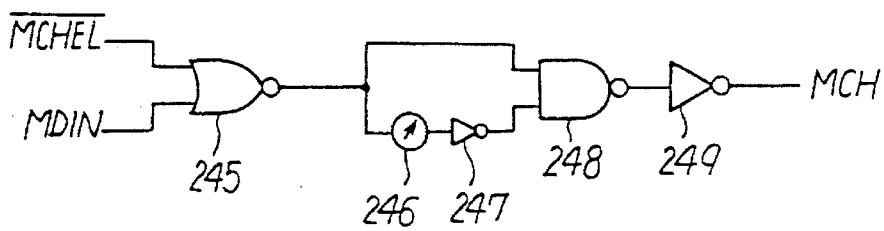
FIG. 39 is a circuit diagram showing a mode change pulse generating circuit.

FIG. 39 shows the mode change pulse generating circuit. As shown, the signal /MCHEL signal and MDIN signal are given to a NOR gate 245. The output of the NOR gate 245 is given to a NAND gate 248 and a time constant circuit 246. The output of the time constant circuit 246 is given to a NAND gate 248 via an inverter 247. The output of the NAND gate 248 is outputted via an inverter 249 as an MCH signal.

Figure 40:
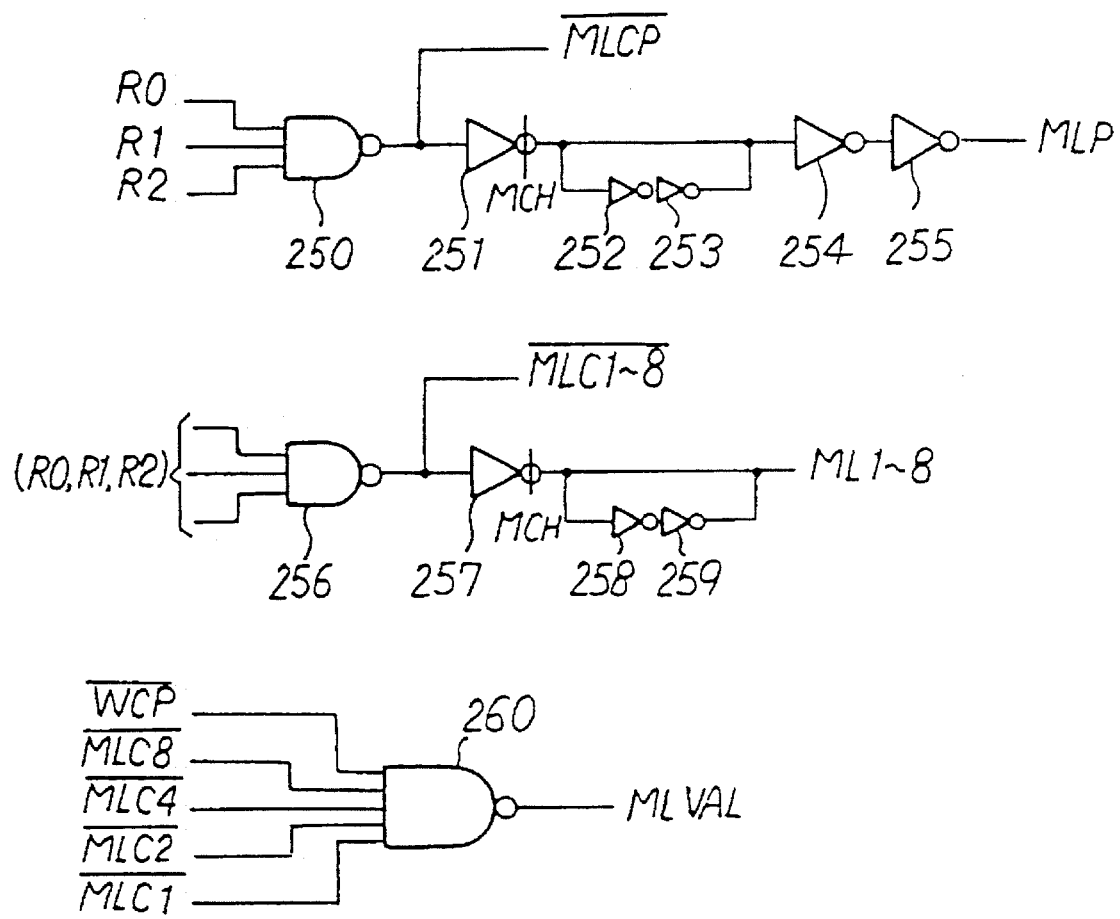
FIG. 40 is a circuit diagram showing a mode length decoder circuit.

FIG. 40 shows the module length decoder circuit. As shown, the R0, R1 and R2 signals are inputted to a NAND gate 250. The output of the NAND gate 250 is outputted as an /MLCP signal. On the other hand, the output of the NAND gate 250 is given to two inverters 252 and 254 via a clocked inverter 251. The output of the inverter 252 is given to an inverter 254 via an inverter 253. The clocked inverter 251 is gate-controlled on the basis of the CH signal. The output of the inverter 254 is outputted via an inverter 255 as an MLP signal. Further, the R0, R1 and R2 signals are inputted to a NAND gate 256. The output of the NAND gate 256 is outputted as /MLC1 to /MLC8 signals. On the other hand, the output of the NAND gate 256 is outputted as ML1 to ML8 signals via a clocked inverter 257. The output of the clocked inverter 257 is self-held by a series-connected circuit composed of two inverters 258 and 259. Further, the /MLC1, /MLC2, /MLC4, /MLC8 and /MLCP signals are inputted to a NAND gate 260 to obtain an MLVAL signal. Here, the clocked inverters 251 and 257 are both gate-controlled on the basis of the MCH signal.

Figure 41:
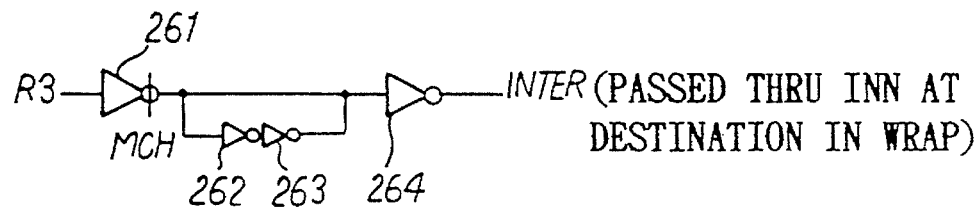
FIG. 41 is a circuit diagram showing a scramble decoder circuit.

FIG. 41 shows the scramble decoder circuit. As shown, the R3 signal is outputted via a series-connected circuit composed of a clocked inverter 261 and an inverter 264 as an INTER signal. Here, the clocked inverter 261 is self-held by a series-connected circuit composed of two inverters 262 and 263. Further, the WRAP signal is passed through an inverter at the destination. The clocked inverter 261 is gate-controlled by the MCH signal.

Figure 42:
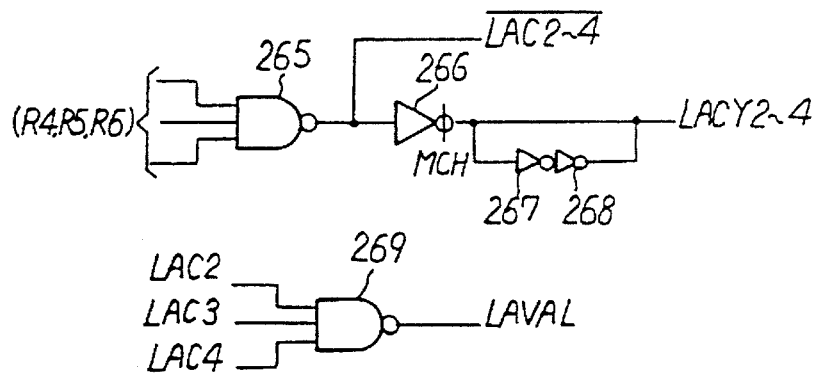
FIG. 42 is a circuit diagram showing a latency decoder circuit.

FIG. 42 shows the latency decoder circuit. As shown, the R4, R5 and R6 signals are inputted to a NAND gate 265. The output of the NAND gate 265 is outputted as /LAC2 to LAC4 signals. On the other hand, the output of the NAND gate 265 is outputted as LACY2 to LACY4 signals via a clocked inverter 266. The output of the clocked inverter 266 is self-held by a series-connected circuit composed of two inverters 267 and 268. Further, the /LAC2, /LAC3, AND /LAC4 signals are inputted to a NAND gate 269 to obtain an LAVAL signal. Here, the clocked inverter 266 is gate-controlled on the basis of the MCH signal.

Figure 43:
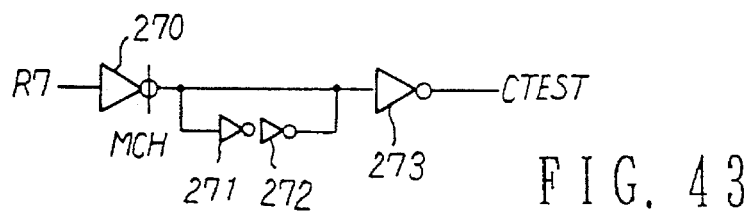
FIG. 43 is a circuit diagram showing a test mode decoder circuit.

FIG. 43 shows the test mode decode circuit. As shown, the R7 signal is outputted via a clocked inverter 270 and an inverter 273 as a CTEST signal. Here, the output of the clocked inverter 261 is self-held by a series-connected circuit composed of two inverters 271 and 272. Further, the clocked inverter 270 is gate-controlled by the MCH signal.

Figure 44:
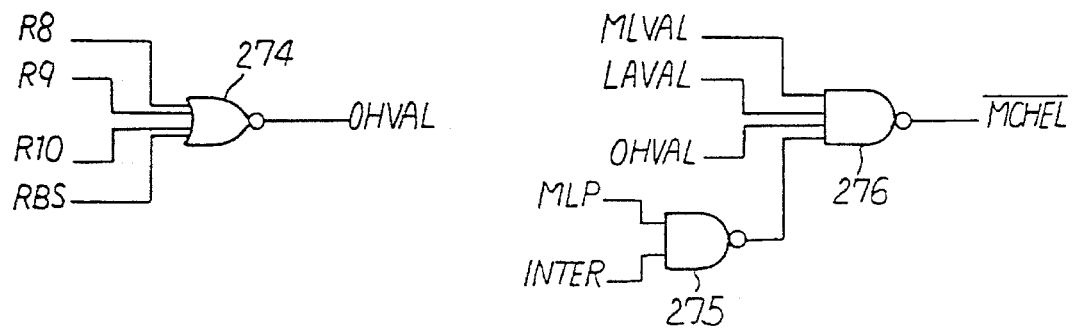
FIG. 44 is a circuit diagram showing a mode change enable detecting circuit.
Figure 47:
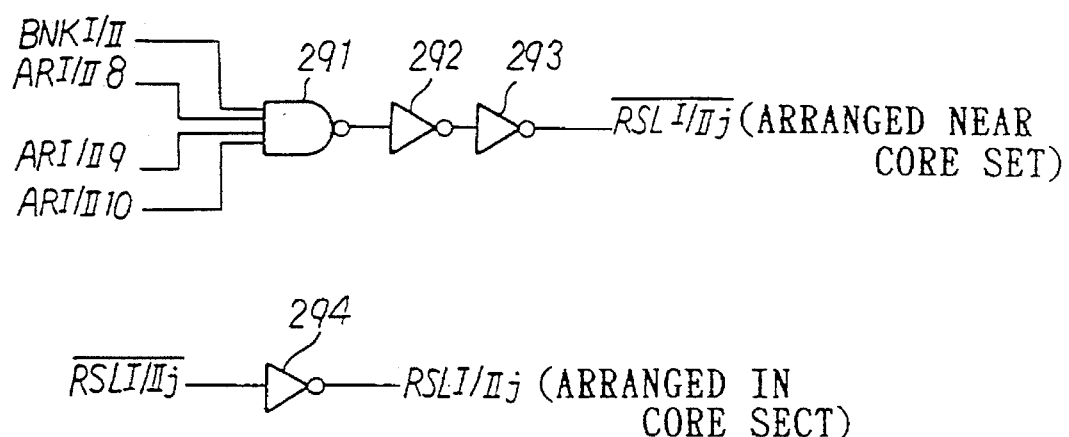
FIG. 47(A) is a circuit diagram showing a row block selector circuit.
FIG. 47(B) is a logical table thereof.

FIG. 44 shows the mode change enable detecting circuit. As shown, the R8, R9, R10 and RBS signals are inputted to a NOR gate 274 to obtain an OHVAL signal. Further, the MLP signal and INTER signal are inputted to a NAND gate 275. The output of the NAND gate 275 is given to a NAND gate 275 together with the MLAVL signal, LAVAL signal and LHVAL signals. The output of the NAND gate 276 is outputted as an /MCHEL signal.

Being different from the general-purpose DRAM, in the synchronous DRAM, it is difficult to effect the tRCD gating from the column system to the row system, due to the restriction in use. Therefore, the bit lines must be sensed securely before the access to the core begins in the column system. Therefore, it is necessary to activate the row system as fast as possible.

In the present invention, the memory device is so constructed that the address is always inputted to the core circuit section and further the portion designated by the BS at the bank activation is activated automatically, in order to activate the core circuit immediately. As the result, the operation margin of the core section can be increased. In other words, in the precharge status, since the address is inputted to the address latch section, it is possible to simultaneously execute the address latch and the core circuit activation on the designated bank side, together with the bank activation. The core section circuit will be described hereinbelow with reference to FIGS. 45 to 52.

Figure 56:
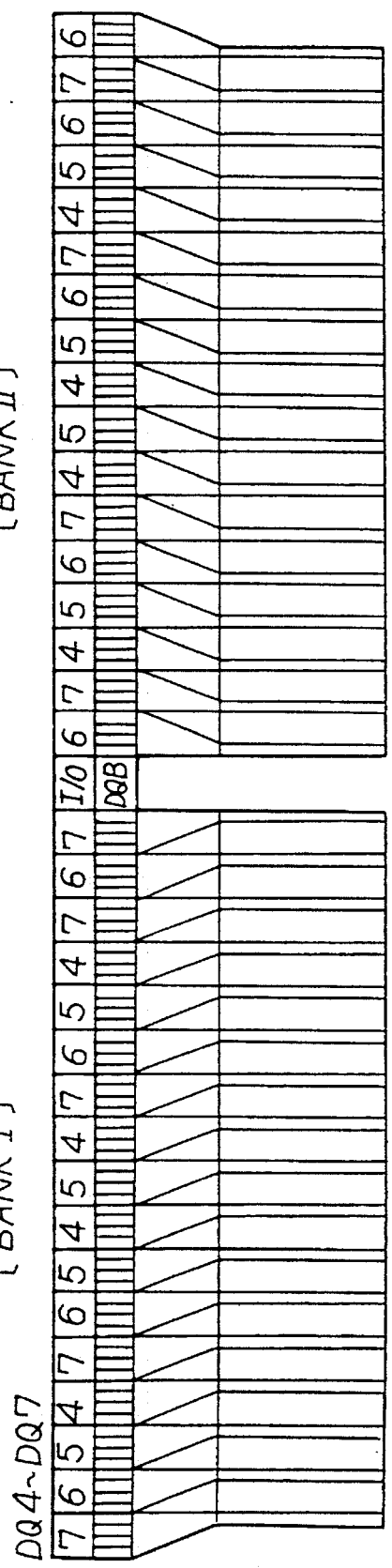
FIG. 56 is an address diagram for the semiconductor memory device.
Figure 56:
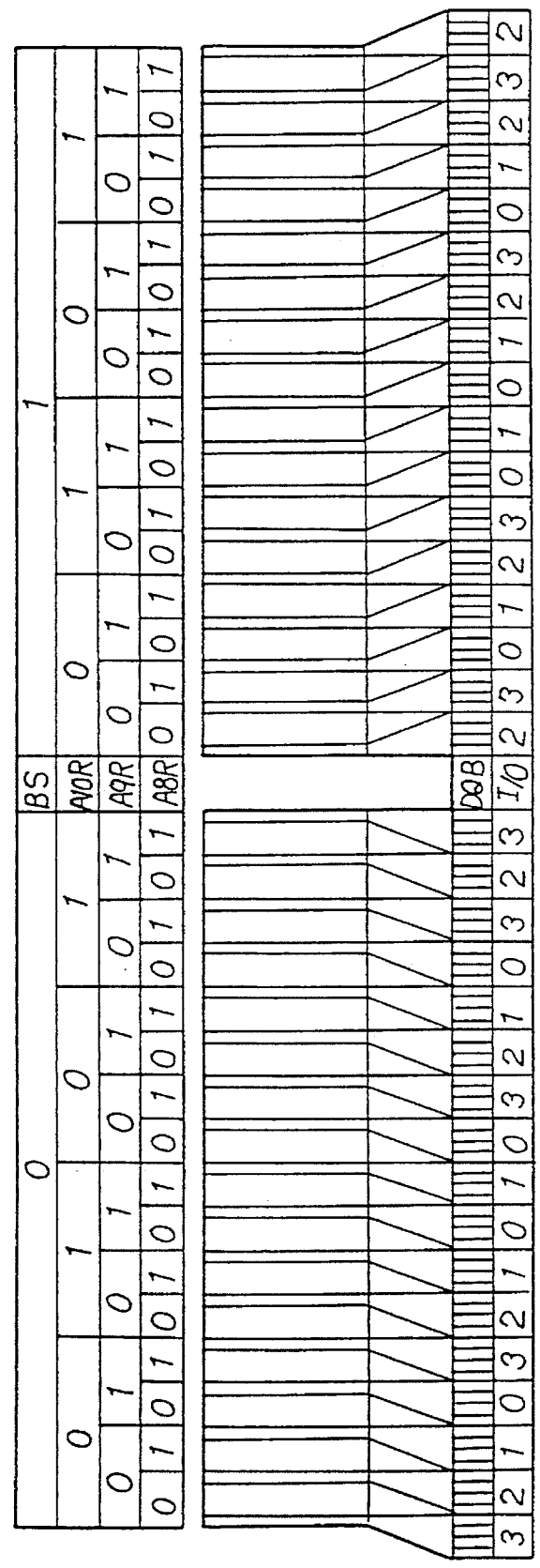

Here, the addresses in the core section are shown by an address correspondence chart in FIG. 56, in which the case of a synchronous DRAM of 1M words, 2 banks, 8 bits and 4 k refresh is listed by way of example.

FIG. 45(A) is a circuit diagram showing the row partial decoder circuit; FIG. 45(B) is a logical table of AR3 and AR2 corresponding to XAj; FIG. 45(C) is a logical table of AR5 and AR4 corresponding to XBj; and FIG. 45(D) is a logical table of AR7 and AR6 corresponding to XCj. As shown, the BNKI/II signal, ARI/II2 signal and ARI/II3 signal are inputted to a NAND gate 277. The output of the NAND gate 277 is outputted via a series-connected circuit composed of inverters 280, 283 and 286 as an XI/IIAj signal. Further, the BNKI/II signal, ARI/II4 signal and ARI/II5 signal are inputted to a NAND gate 278. The output of the NAND gate 278 is outputted via a series-connected circuit composed of inverters 281, 284 and 287 as an XI/IIBj signal. Further, the BNKI/II signal, ARI/II6 signal and ARI/II7 signal are inputted to a NAND gate 279. The output of the NAND gate 279 is outputted via a series-connected circuit composed of inverters 282, 285 and 288 as an XI/IICj signal. The decoded results as shown in FIGS. 45(B), (C) and (D) can be obtained with the use of the above-mentioned circuit configurations.

FIGS. 46(A) and (B) show the word line (WL) decoder circuit, in which FIG. 45(A) is a circuit diagram and FIG. 46(B) is a logic table of AR1 and AR0 corresponding to WSj. As shown, the BNKI/II signal, ARI/II0 signal and ARI/II1 signal are inputted to a NAND gate 289. The output of the NAND gate 289 is outputted via a inverter 290 as a WSI/IIj signal. The decoded results as shown in FIG. 46(B) can be obtained with the use of the above-mentioned circuit configuration.

FIGS. 47(A) and (B) show the row block selector circuit, in which FIG. 47(A) is circuit diagrams, and FIG. 47(B) is a logic table of AR10, AR9 and AR8 corresponding to j. As shown, the BNKI/II signal, ARI/II8 signal, ARI/II9 signal and ARI/II10 signal are inputted to a NAND gate 291. The output of the NAND gate 291 is outputted via a series-connected circuit composed of inverters 292 and 293 as an /RSLI/IIj signal. Further, the /RSLI/IIj signal is outputted via an inverter 294 as an RSLI/IIj signal. Further, the circuits for generating the /RSLI/IIj signals are arranged in the vicinity of the core section, and the circuits for generating the RSLI/IIj signals are arranged in the core section.

The selected results as shown in FIG. 47(B) can be obtained with the use of the above-mentioned circuit configuration.

Figure 48:
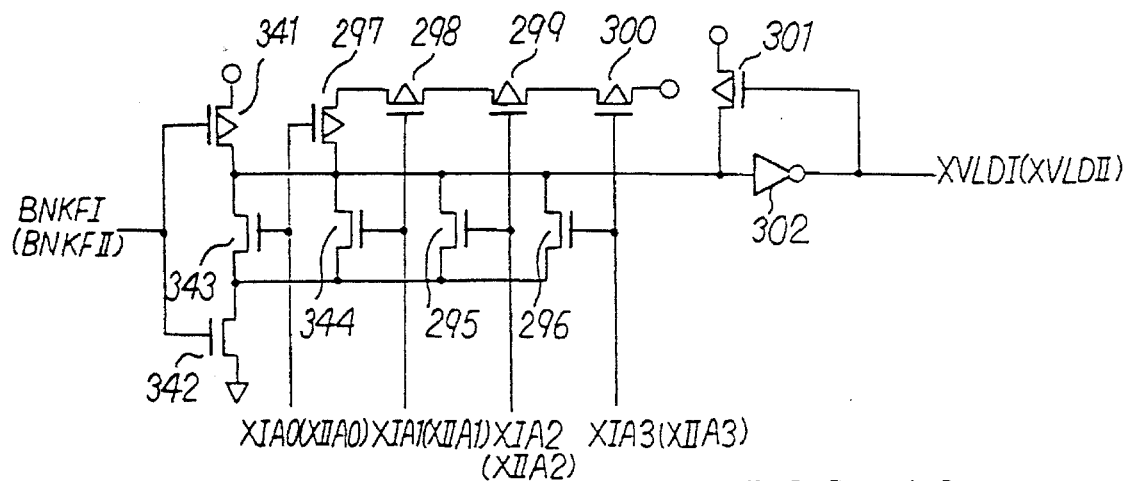
FIG. 48 is a circuit diagram showing a word line activate controlling circuit.

FIG. 48 shows the word line (WL) activation control circuit. As shown, the BNKFI (BNKFII) signal is given to the gates of a P-channel MOS transistor 341 and an N-channel MOS transistor 342, respectively. Further, the XIA0 (XIIA0) signal is inputted to the gates of a P-channel MOS transistor 297 and an N-channel MOS transistor 343, respectively. In the same way, the XIA1 (XIIA1) signal is inputted to the gates of a P-channel MOS transistor 298 and an N-channel MOS transistor 344, respectively. The XIA2 (XIIA2) signal is inputted to the gates of a P-channel MOS transistor 299 and an N-channel MOS transistor 295, respectively. The XIA3 (XIIA3) signal is inputted to the gates of a P-channel MOS transistor 300 and an N-channel MOS transistor 296, respectively. The drain of the transistor 341 is connected to the drains of the transistors 297, 301, 343, 344, 295 and 296 and to an inverter 302, respectively. On the other hand, the drain of the transistor 342 is connected to the sources of the transistors 343, 344, 295 and 296, respectively. The source of the transistor 297 is connected to the drain of the transistor 298; the source of the transistor 297 is connected to the drain of the transistor 299; the source of the transistor 299 is connected to the drain of the transistor 300, respectively. The drain of the transistor 300 is connected to a supply potential. Further, the sources of the transistors 341 and 301 are connected to the supply potential. The output of the inverter 302 is connected to the gate of the transistor 301. By the configuration as above, it is possible to obtain an XVLDI (XVLCII) signal as the output of the inverter 302.

Figure 49:
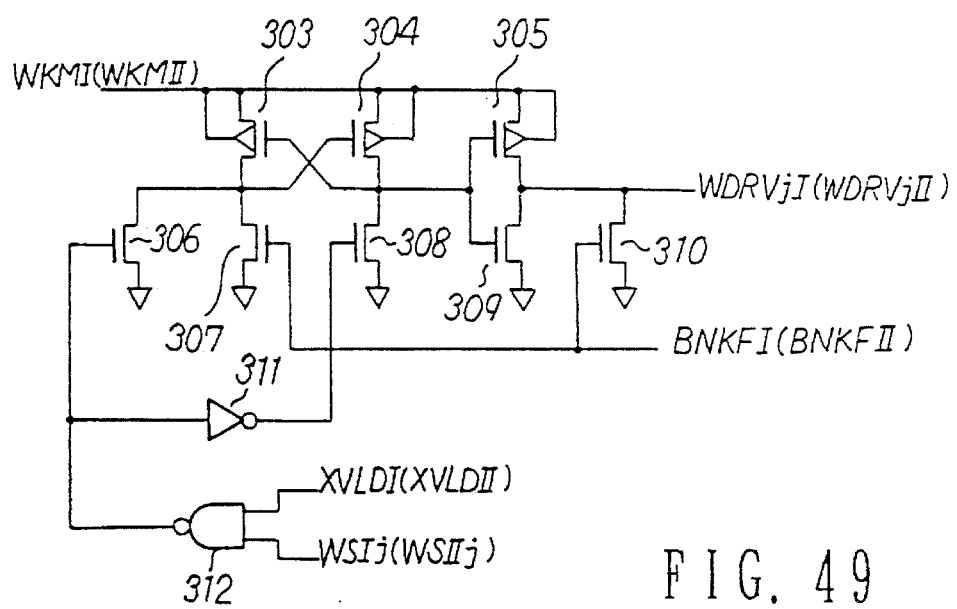
FIG. 49 is a circuit diagram showing a work line driver decoder circuit.

FIG. 49 shows the word line (WL) driver decoder circuit. As shown, the WKMI (WKMII) signal is applied to the sources and the back gates of P-channel MOS transistors 303, 304 and 305. Further, the XVLDI (XVLDII) signal and the WSIj (WSIIj) signal are inputted to the gate of an N-channel MOS transistor 306 via a NAND gate 312. The output of the NAND gate 312 is inputted to the gate of an N-channel MOS transistor 308 via an inverter 311. Further, the BNKFI (BNKFII) signal is inputted to the gates of N-channel MOS transistors 307 and 310. The drain of the transistor 306 is connected to the gates of the transistors 307 and 308 and to the gate of the transistor 304, respectively. Further, the drain of the transistor 308 is connected to the drain of the transistor 304, the gate of the transistor 303, the drain of the transistor 304, the gate of an N-channel MOS transistor 309, and the gate of the transistor 305, respectively. The drains of the transistors 305 and 309 are connected to the drain of the transistor 310 to obtain a WDRVjI (WDRVjII) signal.

Figure 50:
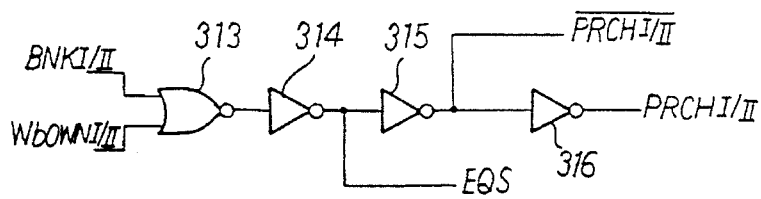
FIG. 50 is a circuit diagram showing a core section precharging circuit.

FIG. 50 shows the core section precharging circuit. As shown, the BNKI/BNKII signal is inputted to a NOR gate 313. The output of the NOR gate 313 is outputted as an EQS signal via an inverter 314, further as a /PRCHI/II signal via an inverter 315, and furthermore as a PRCHI/II signal via an inverter 316, respectively.

Figure 51:
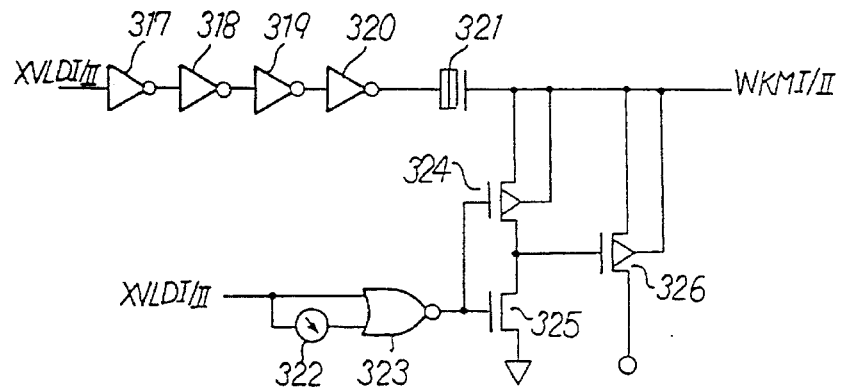
FIG. 51 is a circuit diagram showing a work line boosting circuit.

FIG. 51 shows the work line (WL) boosting circuit. As shown, the XVLDI/II signal is given to a capacitor 321 via a series-connected circuit composed of inverters 317, 318, 319 and 320. In addition, the XVDLI/II signal is inputted to a NOR gate 323 and a time constant circuit 322. The output of the time constant circuit 322 is given to a NOR gate 323. The output of the NOR gate 323 is given to the gates of a P-channel MOS transistor 324 and an N-channel MOS transistor 325. The drains of the complementary-connected transistors 324 and 325 are connected to the gate of a P-channel MOS transistor 326. The source of the transistor 326 is connected to a supply potential. Further, the other end of the capacitor 321, the source and back gate of the transistor 324, and the source and back gate of the transistor 326 are connected in common to obtain a WKMI/II signal.

Figure 52:
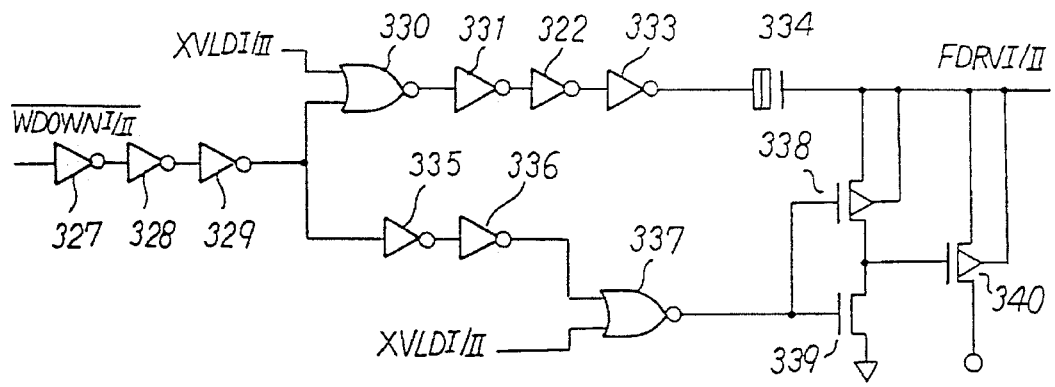
FIG. 52 is a circuit diagram showing a sense amplifier gate driver circuit.

FIG. 52 shows the sense amplifier gate driver circuit. As shown, the /WDOWNI/II signal is inputted to a NOR gate 330 and further an inverter 335 via a series-connected circuit composed of inverters 327, 328 and 329. On the other hand, the XVLDI/II signal is inputted to the NOR gate 330 and the inverter 335. The output of the inverter 335 is inputted to a NOR gate 337 via an inverter 336. The output of the NOR gate 330 is inputted to a capacitor 334 via series-connected inverters 331, 332 and 333. On the other hand, the output of the NOR gate 337 is given to the gates of a P-channel MOS transistor 338 and an N-channel MOS transistor 339. The drains of the complementary-connected transistors 338 and 339 are connected to the gate of a P-channel MOS transistor 340. The source of the transistor 340 is connected to a supply potential. Further, the other end of the capacitor 334, the source and back gate of the transistor 338, and the source and back gate of the transistor 340 are connected in common to obtain an FDRVI/II signal.

Figure 53:
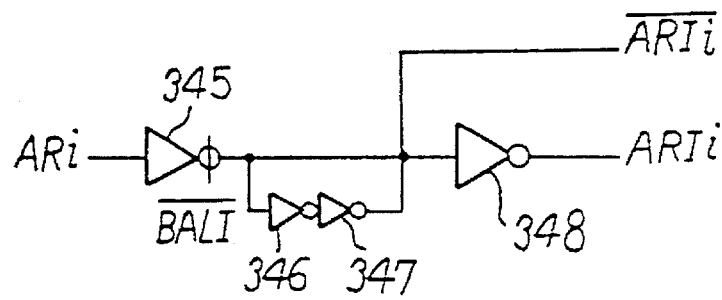
FIG. 53 is a circuit diagram showing bank address latch circuit.
Figure 54:
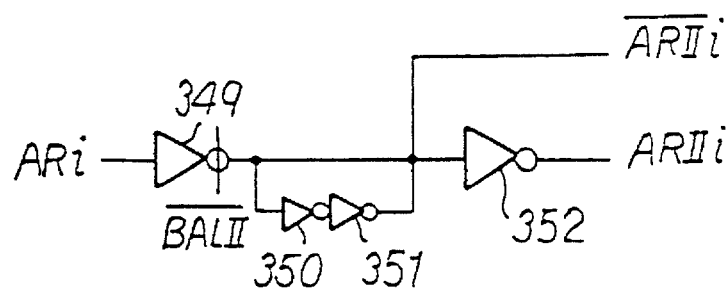
FIG. 54 is a circuit diagram showing a mode address latch circuit.
Figure 54:
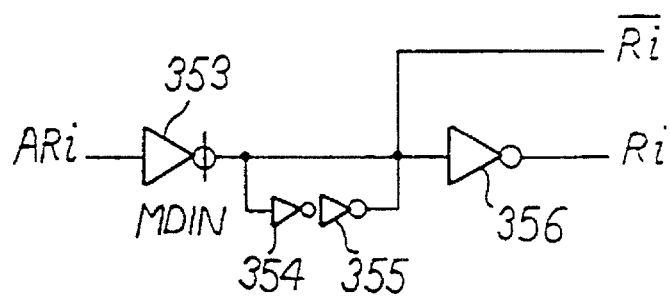

Further, the address latch section can be realized by the circuits as shown in FIGS. 53 and 54.

FIG. 53 shows the bank address latch circuit. As shown, the ARi signal is outputted via a clocked inverter 345 as an /ARIi signal. This signal is inverted by an inverter 348 to obtain an ARIi signal. Further, a self-holding circuit composed of series-connected inverters 346 and 347 is connected to the output side of the clocked inverter 345. Further, the /BALI signal is applied to the clocked inverter 345 as a gate signal. On the other hand, the ARi signal is outputted via a clocked inverter 349 as an /ARIIi signal. This signal is inverted by an inverter 352 to obtain an ARIIi signal. Further, a self-holding circuit composed of series-connected inverters 350 and 351 is connected to the output side of the clocked inverter 349. Further, the /BALII signal is applied to the clocked inverter 349 as a gate signal.

FIG. 54 shows the mode address latch circuit. As shown, the ARi signal is outputted via a clocked inverter 353 as an /Ri signal. This signal is inverted by an inverter 356 to obtain an Ri signal. Further, a self-holding circuit composed of series-connected inverters 354 and 355 is connected to the output side of the clocked inverter 353. Further, the MDIN signal is applied to the clocked inverter 353 as a gate signal.

Further, the column spare address is outputted whenever the address corresponding to the core block selected at the row system activation is decided.

Figure 55:
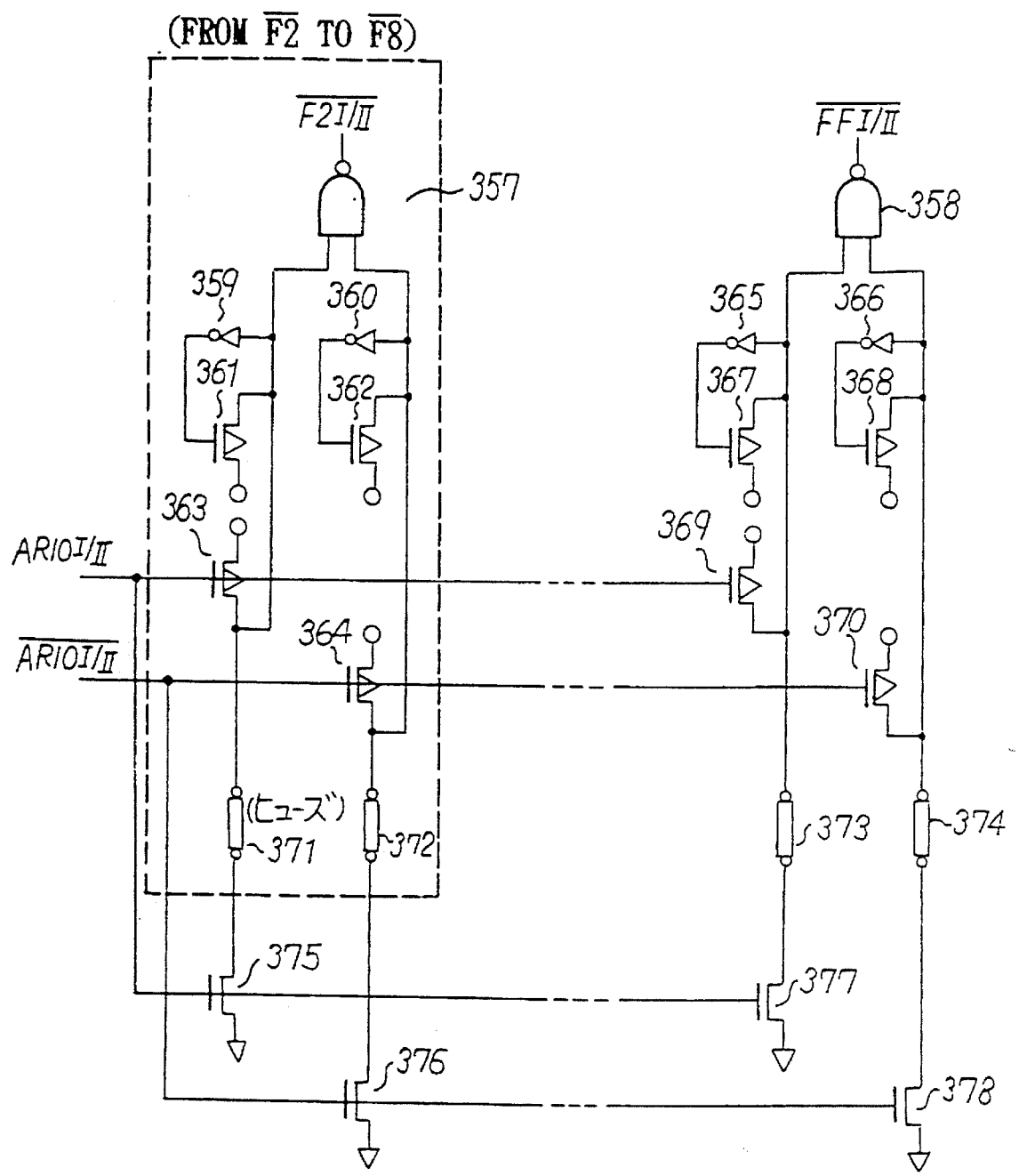
FIG. 55 is a circuit diagram showing a column spare address generating circuit.

FIG. 55 shows the column spare address generating circuit of when the respective fuse sets exist in correspondence to the logical "0" and "1" level of the A1OR signal. As shown, the AR1OI/II signal is inputted to the gates of P-channel MOS transistors 363 and 369 and N-channel MOS transistors 375 and 377. The /AR1OI/II signal is inputted to the gates of P-channel MOS transistors 364 and 370 and N-channel MOS transistors 376 and 378. A fuse 371 is connected between the transistors 363 and 375. A fuse 372 is connected between the transistors 364 and 376. A fuse 373 is connected between the transistors 369 and 377. A fuse 374 is connected between the transistors 370 and 378. Further, the drain of the transistor 363 is connected to the drain of a P-channel MOS transistor 361, an inverter 359 and a NAND gate 357. The output of the inverter 359 is connected to the gate of the transistor 361. On the other hand, the drain of the transistor 364 is connected to the drain of a P-channel MOS transistor 362, an inverter 360 and a NAND gate 357. The output of the inverter 360 is connected to the gate of the transistor 362. Therefore, an F2I/II signal can be obtained as the output of the NAND gate 357.

Further, the drain of the transistor 369 is connected to the drain of a P-channel MOS transistor 367, an inverter 365 and a NAND gate 358. The output of the inverter 365 is connected to the gate of the transistor 367. On the other hand, the drain of the transistor 370 is connected to the drain of a P-channel MOS transistor 368, an inverter 366 and a NAND gate 358. The output of the inverter 366 is connected to the gate of the transistor 368. Therefore, an /FFI/II signal can be obtained as the output of the NAND gate 358. Here, the circuit including the NAND gate 357 is arranged for each spare address /F2 to/F8. Further, the /FF is a spare address use enable signal.

The bank activate/precharge operation and the automatic refresh cycle operation will be described hereinbelow with reference to FIGS. 57 and 58.

Figure 57:
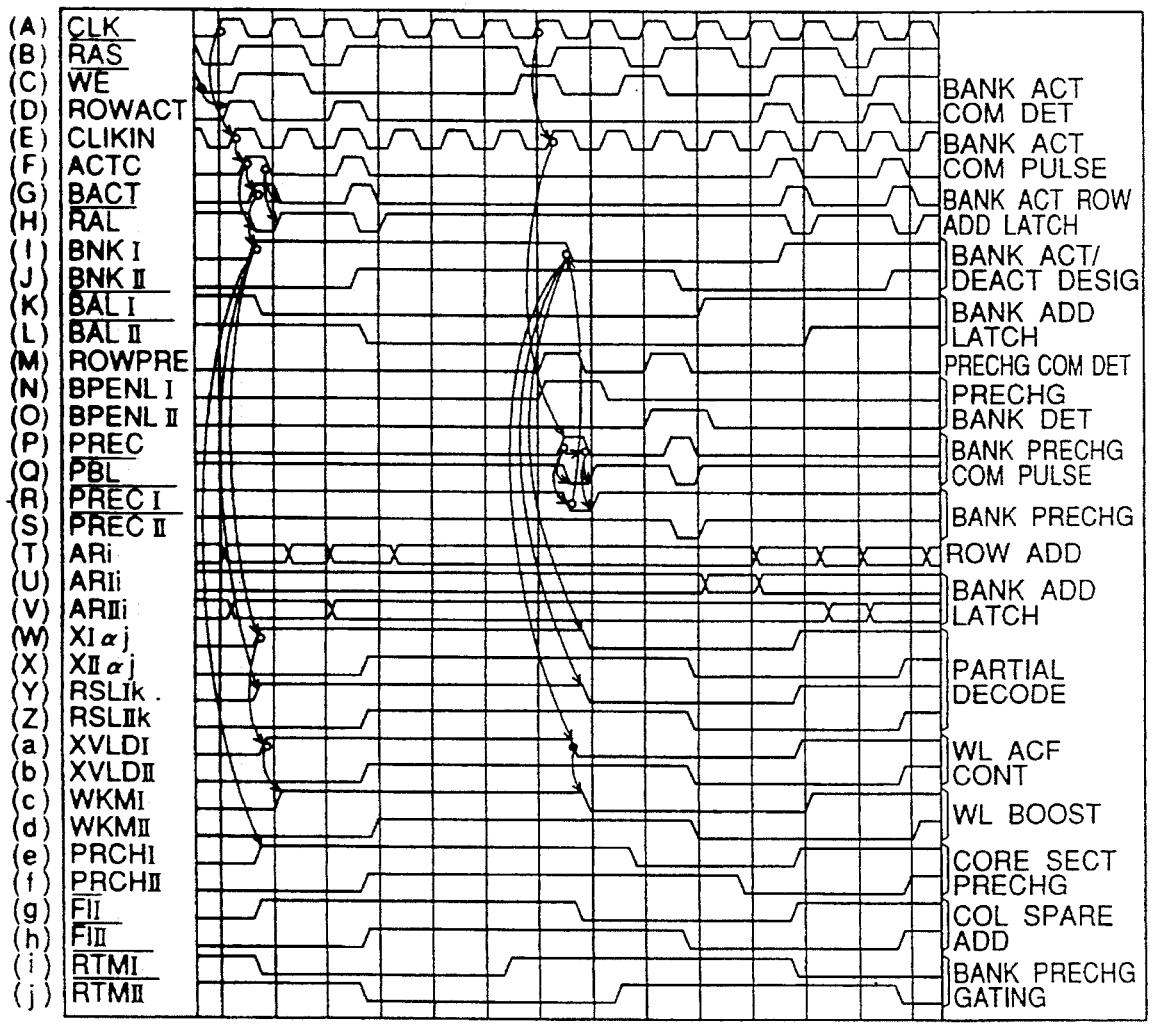
FIG. 57 is a timing chart for assistance in explaining the bank activate and/or precharge operation.

FIG. 57 shows a timing chart for assistance in explaining the bank activate/precharge operation, in which (A) denotes CLK; (B) denotes /RAS; (C) denotes /WE; (D) denotes ROWACT; (E) denotes CLKIN; (F) denotes ACTC; (G) denotes BACT; (H) denotes /RAL; (I) denotes BNKI; (J) denotes BNKZII; (K) denotes /BALI; (L) denotes /BALII; (M) denotes ROWPRE; (N) denotes BPENLI; (O) denotes BPENLII; (P) denotes PREC; (Q) denotes /PBL; (R) denotes /PRECI; (S) denotes /PRECII; (T) denotes ARi; (U) denotes ARIi; (V) ARIIi; (W) denotes XIaj; (X) denotes XIIaj; (Y) denotes RSLIk; (Z) denotes RSLIIk; (a) denotes XVLDI; (b) denoted XVLDII; (c) denotes WKMI, (d) denotes WKMII; (e) denotes PRCHI; (f) denotes PRCHII; (g) denoted /FII; (h) denotes /FIII; (i) denotes /RTMI; and (j) denoted RTMII.

In the case of the bank activation, as shown in FIG. 57, when the row activation begins on the basis of the ROWACT signal (as shown by (D) in FIG. 57), this signal is detected as a bank activation command. Therefore, the bank activation command pulse is outputted as the ACTC signal as shown by (F), so that the bank is activated by the BACT signal shown by (G) and further the row address is latched as shown by (H). On the basis of the bank activation, the bank activation and deactivation are designated as shown by (I) and (J). In this case, the bank I or II is activated by the BNKI signal or the BNKII signal. On the basis of the bank activation, the bank address is latched by the /BALI signal and /BALII signal as shown by (K) and (L). At the same time, the partial precharge is executed by the designation as shown by (W), (X) (Y) and (Z). On the basis of these, the work line activation control is executed as shown by (a) and (b), so that the word lines are boosted as shown by (c) and (d). Further, the core section is precharged as shown by (e) and (f).

In the case of the bank precharge, on the other hand, as shown in FIG. 57, when the PREC signal is given as the bank precharge command pulse as shown by (P) and (Q), the /PBL signal is outputted. As a result, the designated bank is precharged as shown by (R) and (S). At the same time, the partial precharge starts on the designation as shown by (W), (X), (Y) and (Z). On the basis of the operation, the word line activation control is executed as shown by (a) and (b), with the result that the word lines are boosted as shown by (c) and (d).

Here, in FIG. 57, (M) denotes the precharge command detection; (N) and (O) denote the precharged bank detection; (T) denotes the row address; (U) and (V) denote the bank address latch; (g) and (h) denote the column spare address; and (i) and (j) denote bank precharge gating, respectively.

Figure 58:
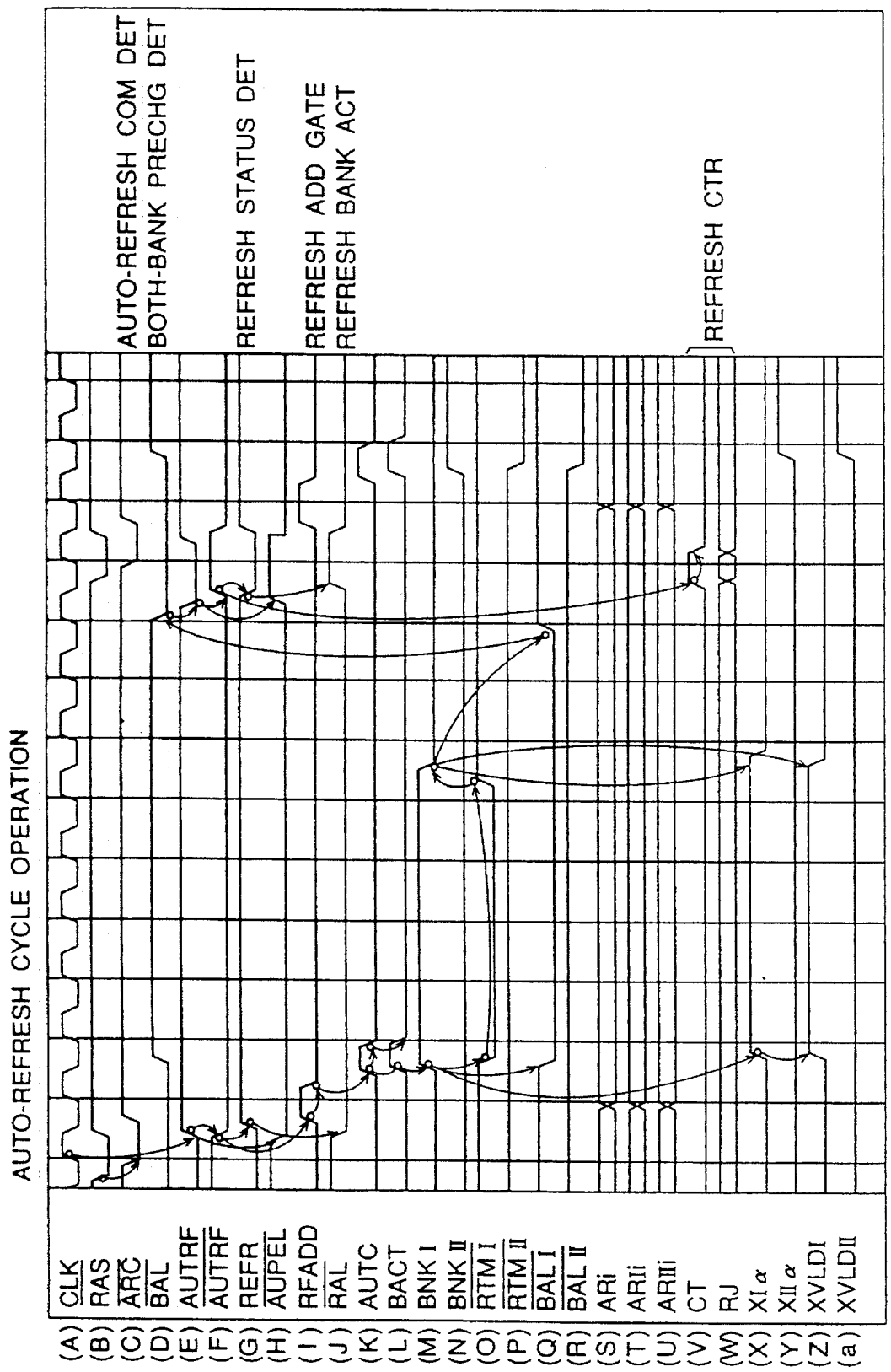
FIG. 58 is a timing chart for assistance in explaining the automatic refresh cycle operation.

FIG. 58 shows a timing chart for assistance in explaining the automatic refresh cycle operation, in which (A) denotes CLK; (B) denotes /RAS; (C) denotes /ARC; (D) denotes /BAL; (E) denotes AUTRF; (F) denotes /AUTRF; (G) denotes PEFR; (H) denotes /AUOEL; (I) denotes RFADD; (J) denotes /RAL; (K) denotes AUTC; (L) denotes BACT; (M) denotes BNKI; (N) denotes BNKII; (O) denotes /RTMI; (P) denotes /RTMII; (Q) denotes /BALI; (R) denotes /BALII; (S) denotes ARi; (T) denotes ARIi; (U) denotes ARIIi; (V) CT; (W) denotes Rj; (X) denotes XIα; (Y) denotes XIIα; (Z) denotes XVLDI; (a) denotes XVLDII.

As shown by (C), when the automatic refresh command is detected by the /ARC signal, the automatic refresh is designated as shown by (E) and (F). As a result, the automatic refresh status is detected as shown by (G). Therefore, the refresh address gate is opened as shown by (I), and the refresh bank is activated as shown by (K), (L), (M) and (N). Further, as shown by (O), (P), (Q) and (R), the gating and the bank address latch are executed, so that the refresh operation is executed as shown by (X), (Y), (Z) and (a).

After the above-mentioned serial operation, when the both-bank precharge detection is effected as shown by (D), the refresh counter is operated as shown by (V) and (W), so that the similar operation is repeated.

Owing to the above-mentioned circuit configuration and the operation the semiconductor memory device of the present invention can realize the high speed operation in combination of various modes.

As described above, in the semiconductor memory device according to the present invention, since the memory is internally composed of a plurality of banks and further the respective banks can be operated independently, it is possible to operate the memory device at high operational speed, so as to follow up the CPU operation executed at a high speed on the basis of a single clock, by use of the same clock, with the result that the hidden-row operation can be realized and thereby the column access can be executed continuously.

TABLE 1

(ROW SYS ARCHITECTURE)

ROW SYS ACTIVATION

COMMAND
- Command acquisition - * New command acquisition is enabled within tRRD (20 nsec).
- Address acquisition - * New command reacquisition is enabled within tRRD (20 nsec).
  * Address is latched by bank activation and released in bank precharge. ⇩

Address is latched for each bank. Two system bank circuits are required.
- Bank activation * Bank activated by BS is designated.
  * Activated bank is precharge by gating /RTM.

SELF REFRESH
- Self counter activation - * Activated by self command in both bank precharge state.
  * Operated until self end by CKE ↗.
  * All reset to 0 after self end.

AUTO REFRESH
- Command acquisition - * Auto command in both bank precharge state.
- Address output - * Internal refresh counter address is used as address upon command acquisition. ⇩

Counter: A0 to BS.
  One set in all.
  BS is the least in connection.
  Count up starts in precharge.
- Bank activation - * Auto command in both bank precharged state.
  * When self refresh counter output is activated.
  * Side selected by counter BS is activated.

TABLE 2

(ROW SYS PRECHARGE)

TABLE 3

(ROW SYS ARCHITECTURE)

POWER DOWN

POWER DOWN MODE

— Entry - * CLK ↗ at CKE=L when both banks are precharged.
              * Initial stages other than CKE and CLK are stopped.

— Exit  - * CKE ↗ when both banks are precharged.

SELF REFRESH POWER DOWN

— Entry - * When self refresh starts.
              * Initial stages other than CKE are stopped.

— Exit  - Self refresh ends at CKE ↗.

MODE SET

COMMAND

— Set         - * Mode set cycle at MRRST=H or /MWSTP=L.
                    (Stage at which module length acess ends.)
                    * A0 to BS are acquired.

— Mode decode - * Mode is not changed when there is no effective mode combination.
                    ⇓
                    (Mode register gate is not opened.)

TABLE 4

(ARCHITECTURE)

CORE SECT CKT

WL SYSTEM
    — * System which starts from XVLD (existing for each bank).
    — * WDRV is decoded at A0 and A1.
    — * $\phi_r$ driver operates at same timing as WDRV.

R/D SYSTEM
    — * System which starts from $X_A$, $X_B$, $X_C$ ($X_\alpha$ are all set to L into precharged state).
    — * Row spare decoder is also operated.

TABLE 4-continued

(ARCHITECTURE)

RSL SYSTEM
    — * System controls circuits related to cell arrays (e.g., row equalization).
    — * System activates column system spare circuits.

K SYSTEM
    — * System further decodes K decoded by BS by row address BS.

TABLE 5

(BANK OPERATION)

BANK ACT/PRE STUDY

BANK ACTIVATION
    — * Side selected by BS is activated by bank activate pulse (BACT).
        — * BS is being outputted by row address buffer.
        — * Bank activate pulse - Outputted in auto refresh or ACT command.

TABLE 5-continued (BANK OPERATION)

BANK PRE
— * When PRE command is inputted at /RTM=H.
— * When /RTM  in auto refresh.
— * When auto precharge signal is activated in auto pre designation.
⇓
Precharge starts when any one of these is satisfied.

TABLE 5-continued (BANK OPERATION)

* ACT/PRE is decided by inputting command.
⇓
* Once ACT/PRE state starts, it is impossible to return internal state to preceding state on the basis of states of other external signals.

TABLE 6

(BANK OPERATION)

ATC COMMAND DETECTION
  COMMAND DETECTION
    — * CLK  edge at /CS=L, /RAS=L, /CAS=H, /WE=H.
        — * Row address buffer output is latched (/PAL).
        — * Bank activate pulse is outputted (ACTCO).
BANK ADDRESS LATCH CONTROL
  ADDRESS LATCH
    — * Latch section exists for each bank (/BALI/II).
    — * When bank is activated, address is latched.
  ADDRESS LATCH RELEASE
    — * Bank is precharged and address latch is released.
ROW ADDRESS BUFFER
  (ARL)

* There exists the case where row/column is activated continuously.
  ⇓
* Row address buffer and column address buffer must be separated from each other.
* Internal address lines must be separated between row and column.
* Address is latched or released in response to ROW ACT command detection pulse.
    — *Latched until bank address latch begins.
* Address buffer is always in address output state.

TABLE 7

(BANK OPERATION)

AUTO REFRESH STUDY

— * CLK  edge at /CS=L, /RAS=L, /CAS=L, /WE=H, CKE=H and in both bank precharged state.
— * When self refresh timing counter is activated (/SLFTP).
        ⇓
        Auto refresh detection signal is activated (AUTRF).
— * When both bank are precharged after auto refresh - Auto refresh detection signal is reset.
BANK ACTIVATION
    — * Bank activating pulse is outputted whenever auto refresh detection condition is satisfied (AUTC).
        — * Bank activating pulse is outputted in bank ACT/PRE detection.

TABLE 7-continued

(BANK OPERATION)

BANK PRECHARGE

— * Precharge is enabled from /RTM ↗ (/AUPEL).

— * Controlled so that precharge starts after /RTM ↗ by use of A7 in mode set cycle (MODE7).

REFRESH COUNTER

— * On auto refresh detection condition, address buffer output gate is closed (REFR).
  — * Pulse for outputting counter value is formed (RFADD).
— * Upon auto refresh detection signal reset, address buffer output gate is opened.
  — * Counted up whenever detection signal is reset. (Must be operated a signal not related to A7.)

COUNTER TEST

— * Column system selected by refresh counter output BS is activated.
  — * BS input value is disregarded even in column access cycle. ⇓
     Because it is not clear which side is activated until counter outputs a value so that it is impossible to select activated side by column address.

TABLE 8

(BANK OPERATION)

SELF REFRESH DETECTION
(/SLFTP)
  COMMAND DETECTION

— * Being set CLK ↗ edge at /CS=L, /RAS=L, /CAS=L, /WE=H, CKE=L.

— * Self refresh state is reset at CKE ↗.

SELF CYCLE COUNTER

— * Self command is set to activate counter.
  — * Self state is reset ─┬─ * Counter is stopped.
                            └─ * Counter is reset.

TEST MODE RELEASE

— * Self command is set to set A7 of mode register to zero.
  — * Value latched by mode register is returned by self command reset.

POWER DOWN SETTING

— * Power down signal is outputted when self command signal is being set.

PRECHARGE COMMAND DETECTION
  COMMAND DETECTION

— *CLK ↗ edge at /CS=L, /RAS=L, /CAS=L, /WE=L (PREC).

TABLE 8-continued

(BANK OPERATION)

```
┌ BANK DESIGNATION ┐
│
├─ * Row address buffer output A10, BS is latched by PRE
│     command detection (A10PR, BSPR).
│                     └─ *Latched by register
│                          different from ACT side for
│                          ACT input on next CLK.
├─ * Bank designation or both banks are selected by A10.
│     └─ * Both bank desig is effective only at both /RTMI/II=H.
└─ * Precharge pulse is outputted after PRE command detection
      to reset BANK ACT/PRE of designated bank to precharge
      state (PRECI/II).
          └─ * BANK ACT/PRE pulse is prepared for each bank.
┌ AUTO PRE BANK DETECTION ┐
┌ AUTO PRE DESIGNATION ┐
│
├─ * A10, BS are latched when column access command is
│     inputted.
│         ├─ * Precharged bank is designated by BS.
│         └─ * Auto precharged bank is designated at A10=H.
│
└─ * Precharge starts at CLK ↗ edge at /WMR=L, /NONCLA=L (AUTP).
```

TABLE 9

(POWER DOWN)

```
┌ POWER DOWN ┐
  ┌ IN SELF REFRESH ┐
  │
  ├─ * Initial stage other than CLE is stopped in self refresh.
  │    (/SLFRE ↘ )
  │              ↘
  │                * CLK, /RAS, /CAS, /CS are reset into H
  │                  acquisition state (/SELPD).
  └─ * All initial stages are activated after release through
       self refresh mode (SLFRE ↗ ).

┌ IN POWER DOW MODE ┐
  │
  ├─ * Power down starts when both bank precharge state and
  │    CKE=L are satisfied.
  │        * Both bank precharge state starts at
  │          BNKI=L, BNKII=L (not at BALI=H).
  │          All right if core section is not yet
  │          precharged completely.
  │                    ⇓
  │          *Initial stages other than CKE, CLK are
  │          stopped (/STBPD).
  ├─ * Power down ends at CKE ↗ edge.
  │                  └─ * All initial stages are activated.
  └─ * Power down mode starts ─┬─ * Serial system is stopped.
                               ├─ * HIZ input is disabled.
                               └─ * Serial system starts to
                                     operate after next
                                     column access cycle
                                     starts.
```

TABLE 10

(MODE REGISTER SET)

| MODE SET CYCLE |
| MODE SET |

— * CLK ⁄ edge at /CS=L, /RAS=L, /CAS=L, /WE=L, CMLAT=L.
  * Row address is latched (pulse).
  * Row address is acquired into mode register (pulse).
  * When no effective combination exists in acquired modes, acquired modes are not outputted.
— * Self refresh mode starts to execute output to A7 mode lines forcedly.

TABLE 11

(MODE REGISTER SET)

(A) (MODULE LENGTH)

| $A_2$ $A_1$ $A_0$ | MODULE LENGTH | OUTPUT |
|---|---|---|
| 0 0 0 | 1 | ML 1 |
| 0 0 1 | 2 | ML 2 |
| 0 1 0 | 4 | ML 4 |
| 0 1 1 | 8 | ML 8 |
| 1 1 1 | PAGE | ML P |

(B) (SCRAMBLE)

| $A_3$ | SCRAMBLE | OUTPUT |
|---|---|---|
| 0 | WRAP | NRAP |
| 1 | INTER | INTRR |

(C) (LATENCY)

| $A_6$ $A_5$ $A_4$ | LATENCY |
|---|---|
| 0 1 0 | 2 |
| 0 1 1 | 3 |
| 1 0 0 | 4 |

(D) (TEST MODE)

| $A_7$ | TEST | OUTPUT |
|---|---|---|
| 0 | IMPOSSIBLE | CREST |
| 1 | POSSIBLE | |

(E) (MODE CHANGE)

| BS | $A_{10}$ | $A_9$ | $A_8$ | MODE CHANGE | OUTPUT |
|---|---|---|---|---|---|
| 0 | 0 | 0 | 0 | POSSIBLE | OHVAL |
| OTHERS | | | | IMPOSSIBLE | |

I claim:

1. A DRAM, comprising;

a memory, cell array divided into a plurality of banks each having a plurality of dynamic type memory cells arranged into substantially a matrix pattern, data being writable in and readable from each memory cell and further the data written in the memory cells being refreshable;

activating means for activating the memory cells to be read, written and refreshed;

precharging means for precharging data lines connected to the memory cells to be read;

a plurality of address latch sections each provided for each bank, each for latching addresses of the memory cells to be read, written and refreshed, each of said address latch sections being set to a latch status when said bank is activated and to a latch release status when said bank is precharged; and command detecting means for detecting commands and outputting control signals corresponding to the detected commands to operate the DRAM in correspondence to the respective commands, said command detecting means being composed of a plurality of command detecting circuits each provided for a plurality of said banks in common to detect one command, said refresh being executed when an auto-refresh command detecting circuit detects that an auto-refresh command is applied thereto periodically, a self-refresh being executed when a self-refresh command detecting circuit outputs a self-refresh command periodically applied thereto to the auto-refresh command detecting circuit.

2. The DRAM of claim 1, wherein said activating means comprises a plurality of activating circuits each corresponding to each of said banks; and said precharging means comprises a plurality of precharging circuits each corresponding to each of said banks.

3. The DRAM of claim 2, which further comprises an address buffer for storing addresses indicative of the memory cells to be activated and for outputting the stored addresses to said address latch sections; wherein said command detecting means comprises an activated command detecting circuit such that, when said activated command detecting circuit detects an activation command, said address buffer, one of said address latch sections and one of said activating circuits cooperate to latch the addresses stored in said address buffer into said address latch section and activate the memory cells of the bank corresponding to the latched addresses.

4. The DRAM of claim 2, wherein when two active commands are applied twice repeatedly from said activating circuits to the bank corresponding thereto, each of said banks is operated on the basis of a first command, without regard for a second command.

5. The DRAM of claim 3, wherein when two active commands are applied twice repeatedly from said activating circuits to the bank corresponding thereto, each of said banks is operated on the basis of a first command, without regard for a second command.

6. The DRAM of claim 1, which further comprises:

a read register for storing data read from the memory cells; and a control circuit for controlling output of data from said read register to an output buffer so that, after the precharge command has been inputted, said control circuit controls said read register to output valid read data obtained before the precharge command.

7. The DRAM of claim 2, which further comprises:

a read register for storing data read from the memory cells; and a control circuit for controlling output of data from said read register to an output buffer so that, after the precharge command has been inputted, said control circuit controls said read register to output valid read data obtained before the precharge command.

8. The DRAM of claim 3, which further comprises:

a read register for storing data read from the memory cells; and a control circuit for controlling output of data from said read register to an output buffer so that, after the precharge command has been inputted, said control circuit controls said read register to output valid read data obtained before the precharge command.

9. The DRAM of claim 1, which further comprises all-bank precharging means for outputting to said precharge means an all-bank precharge signal for precharging all the banks forcedly to said precharge means; and precharge gating means for outputting a precharge gating signal for preventing one or plural of said banks from being precharged, the all bank precharge signal being invalidated by the precharge gating signal.

10. The DRAM of claim 2, which further comprises all-bank precharging means for outputting to said precharge means an all-bank precharge signal for precharging all the banks; and precharge gating means for outputting a precharge gating signal for preventing one or plural of said banks from being precharged, the all bank precharge signal being invalidated by the precharge gating signal.

11. The DRAM of claim 3, which further comprises all-bank precharging means for outputting to said precharge means an all-bank precharge signal for precharging all the banks; and precharge gating means for outputting a precharge gating signal for preventing one or plural of said banks from being precharged, the all bank precharge signal being invalidated by the precharge gating signal.

12. The DRAM of claim 8, which further comprises all-bank precharging means for outputting to said precharge means an all-bank precharge signal for precharging all the banks; and precharge gating means for outputting a precharge gating signal for preventing one or plural of said banks from being precharged, the all bank precharge signal being invalidated by the precharge gating signal.

13. The DRAM of claim 1, wherein the refresh is executed for the memory cells of the addresses designated by a refresh counter; and in counter test, a column system of said bank including the memory cells designated by the refresh counter is automatically activated.

14. The DRAM of claim 2, wherein the refresh is executed for the memory cells of the addresses designated by a refresh counter; and in counter test, a column system of said bank including the memory cells designated by the refresh counter is automatically activated.

15. The DRAM of claim 3, wherein the refresh is executed for the memory cells of the addresses designated by a refresh counter; and in counter test, a column system of said bank including the memory cells designated by the refresh counter is automatically activated.

16. A DRAM, comprising:

a memory cell array divided into a plurality of banks each having a plurality of dynamic type memory cells arranged into substantially a matrix pattern, data being writable in and readable from each memory cell and further the data written in the memory cells being refreshable;

activating means for activating the memory cells to be read, written and refreshed;

precharging means for precharging data lines connected to the memory cells to be read; and command detecting means for detecting commands and outputting control signals corresponding to the detected commands, to operate the DRAM in correspondence to the respective commands, said command detecting means being composed of a plurality of command detecting circuits each provided for a plurality of said banks in common to detect one command, said refresh being executed when an auto-refresh command detecting circuit detects that an auto-refresh command is applied thereto periodically; and self-refresh being executed when a self-refresh command detecting circuit outputs a self-refresh command periodically applied thereto to the auto-refresh command detecting circuit, wherein the refresh is executed for the memory cells of the addresses designated by a refresh counter; and in counter test, a column system of said bank including the memory cells designated by the refresh counter is automatically activated.

17. The DRAM of claim 16, which further comprises a plurality of address latch sections each provided for each bank, each for latching addresses of the memory cells to be read, written and refreshed, each of said address latch sections being set to a latch status when said bank is activated and to a latch release status when said bank is precharged.

18. The DRAM of claim 17, wherein said activating means comprises a plurality of activating circuits each corresponding to each of said banks; and said precharging means comprises a plurality of precharging circuits each corresponding to each of said bank.

19. The DRAM of claim 18, which further comprises an address buffer for storing addresses indicative of the memory cells to be activated and for outputting the stored addresses to said address latch sections; wherein said command detecting means comprises an activated command detecting circuit such that, when said activated command detecting circuit detects an activation command, said address buffer, one of said address latch sections and one of said activating circuits cooperate to latch the addresses stored in said address buffer into said address latch section and activate the memory cells of the bank corresponding to the latched addresses.

20. The DRAM of claim 18, wherein when two active commands are applied twice repeatedly from said activating circuits to the bank corresponding thereto, each of said banks is operated on the basis of a first command, without regard for a second command.

21. The DRAM of claim 19, wherein when two active commands are applied twice repeatedly from said activating circuits to the bank corresponding thereto, each of said banks is operated on the basis of a first command, without regard for a second command.

22. The DRAM of claim 16, which further comprises:

a read register for storing data read from the memory cells; and a control circuit for controlling output of data from said read register to an output buffer so that, after the precharge command has been inputted, said control circuit controls said read register to output valid read data obtained before the precharge command.

23. The DRAM of claim 17, which further comprises:

a read register for storing data read from the memory cells; and a control circuit for controlling output of data from said read register to an output buffer so that, after the precharge command has been inputted, said control circuit controls said read register to output valid read data obtained before the precharge command.

24. The DRAM of claim 18, which further comprises:

a read register for storing data read from the memory cells; and a control circuit for controlling output of data from said read register to an output buffer so that, after the precharge command has been inputted, said control circuit controls said read register to output valid read data obtained before the precharge command.

25. The DRAM of claim 19, which further comprises:

a read register for storing data read from the memory cells; and a control circuit for controlling output of data from said read register to an output buffer so that, after the precharge command has been inputted, said control circuit controls said read register to output valid read data obtained before the precharge command.

26. The DRAM of claim 16, which further comprises all-bank precharging means for outputting an all-bank precharge signal to said precharge means for precharging all the banks; and precharge gating means for outputting a precharge gating signal for preventing one or plural of said banks from being precharged, the all bank precharge signal being invalidated by the precharge gating signal.

27. The DRAM of claim 17, which further comprises all-bank precharging means for outputting an all-bank precharge signal to said precharge means for precharging all the banks; and precharge gating means for outputting a precharge gating signal for preventing one or plural of said banks from being precharged, the all bank precharge signal being invalidated by the precharge gating signal.

28. The DRAM of claim 18, which further comprises all-bank precharging means for outputting an all-bank precharge signal to said precharge means for precharging all the banks; and precharge gating means for outputting a precharge gating signal for preventing one or plural of said banks from being precharged, the all bank precharge signal being invalidated by the precharge gating signal.

29. The DRAM of claim 19, which further comprises all-bank precharging means for outputting an all-bank precharge signal to said precharge means for precharging all the banks; and precharge gating means for outputting a precharge gating signal for preventing one or plural of said banks from being precharged, the all bank precharge signal being invalidated by the precharge gating signal.

30. The DRAM of claim 25, which further comprises all-bank precharging means for outputting an all-bank precharge signal to said precharge means for precharging all the banks; and precharge gating means for outputting a precharge gating signal for preventing one or plural of said banks from being precharged, the all bank precharge signal being invalidated by the precharge gating signal.

31. The DRAM of claim 17, wherein the refresh is executed for the memory cells of the addresses designated by a refresh counter; and in counter test, a column system of said bank including the memory cells designated by the refresh counter is automatically activated.

32. The DRAM of claim 18, wherein the refresh is executed for the memory cells of the addresses designated by a refresh counter; and in counter test, a column system of said bank including the memory cells designated by the refresh counter is automatically activated.

33. The DRAM of claim 19, wherein the refresh is executed for the memory cells of the addresses designated by a refresh counter; and in counter test, a column system of said bank including the memory cells designated by the refresh counter is automatically activated.

34. A DRAM, comprising:

a memory cell array divided into a plurality of banks each having a plurality of dynamic type memory cells arranged into substantially a matrix pattern, data being writable in and readable from each memory cell and further the data written in the memory cells being refreshable;

activating means for activating the memory cells to be read, written and refreshed;

precharging means for precharging data lines connected to the memory cells to be read;

a plurality of address latch sections each provided for each bank, each for latching addresses of the memory cells to be read, written and refreshed, each of said address latch sections being set to a latch status when said bank is activated and to a latch release status when said bank is precharged; and command detecting means for detecting commands and outputting control signals corresponding to the detected commands to operate the DRAM in correspondence to the respective commands, said command detecting means being composed of a plurality of command detecting circuits each provided for a plurality of said banks in common to detect one command.

35. The DRAM of claim 34, wherein said activating means comprises a plurality of activating circuits each corresponding to each of said banks and said precharging means comprises a plurality of precharging circuits each corresponding to each of said banks.

36. The DRAM of claim 35, which further comprises an address buffer for storing addresses indicative of the memory cells to be activated and for outputting the stored addresses to said address latch sections; wherein said command detecting means comprises an activated command detecting circuit such that, when said activated command detecting circuit detects an activation command, said address buffer one of said address latch sections and one of said activating circuits cooperate to latch the addresses stored in said address buffer into said address latch section and activate the memory cells of the bank corresponding to the latched addresses.

37. The DRAM of claim 35, wherein when two active commands are applied twice repeatedly from said activating circuits to the bank corresponding thereto, each of said banks is operated on the basis of a first command, without regard for a second command.

* * * * *